(12) United States Patent
Mizuhashi et al.

(10) Patent No.: US 10,970,510 B2
(45) Date of Patent: *Apr. 6, 2021

(54) SENSOR AND SENSOR-EQUIPPED DISPLAY DEVICE

(71) Applicant: Japan Display Inc., Tokyo (JP)

(72) Inventors: Hiroshi Mizuhashi, Tokyo (JP); Gen Koide, Tokyo (JP); Hayato Kurasawa, Tokyo (JP); Toshio Soya, Tokyo (JP); Fumitaka Gotoh, Tokyo (JP)

(73) Assignee: Japan Display Inc., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 16/173,715

(22) Filed: Oct. 29, 2018

(65) Prior Publication Data

US 2019/0065807 A1 Feb. 28, 2019

Related U.S. Application Data

(63) Continuation of application No. 16/008,239, filed on Jun. 14, 2018, now Pat. No. 10,146,987, which is a (Continued)

(30) Foreign Application Priority Data

Oct. 9, 2015 (JP) .................................. 2015-200807

(51) Int. Cl.
*G06K 9/00* (2006.01)
*G06F 3/041* (2006.01)
(Continued)

(52) U.S. Cl.
CPC ....... *G06K 9/0002* (2013.01); *G02F 1/13338* (2013.01); *G02F 1/134336* (2013.01);
(Continued)

(58) Field of Classification Search
CPC .............. G06K 9/0002; G02F 1/13338; G02F 1/134336; G02F 1/136286; G02F 1/1368;
(Continued)

(56) References Cited

U.S. PATENT DOCUMENTS 4,345,248 A 8/1982 Togashi et al.
5,392,058 A 2/1995 Tagawa
(Continued)

FOREIGN PATENT DOCUMENTS

JP 2003-090703 A 3/2003
JP 2004-317353 A 11/2004
(Continued)

OTHER PUBLICATIONS

Japanese Office Action dated Dec. 17, 2019, in corresponding Japanese Application No. 2019-052170.
(Continued)

*Primary Examiner* — Manav Seth
(74) *Attorney, Agent, or Firm* — K&L Gates LLP

(57) ABSTRACT

According to one embodiment, a sensor includes a first control line, a first signal line, a first detection switch, a common electrode, a first detection electrode, a first circuit and a second circuit. The common electrode is located above the first control line, the first signal line and the first detection switch, opposed to the first control line, the first signal line and the first detection switch. The first detection electrode is located above the common electrode. The first circuit and the second circuit are located under the common electrode, and are opposed to the common electrode.

12 Claims, 24 Drawing Sheets

Related U.S. Application Data continuation of application No. 15/285,064, filed on Oct. 4, 2016, now Pat. No. 10,025,970.

(51) Int. Cl.

| | |
|---|---|
| *G06F 3/044* | (2006.01) |
| *G02F 1/1333* | (2006.01) |
| *G02F 1/1343* | (2006.01) |
| *G02F 1/1362* | (2006.01) |
| *H05K 1/02* | (2006.01) |
| *G02F 1/1368* | (2006.01) |

(52) U.S. Cl.
CPC ...... *G02F 1/136286* (2013.01); *G06F 3/0412* (2013.01); *G06F 3/0443* (2019.05); *G06F 3/0446* (2019.05); *G06F 3/04164* (2019.05); *G06F 3/041662* (2019.05); *H05K 1/0274* (2013.01); *G02F 1/1368* (2013.01); *G02F 1/133345* (2013.01); *G02F 2001/136218* (2013.01); *G02F 2201/121* (2013.01); *G02F 2201/123* (2013.01); *H05K 2201/0326* (2013.01); *H05K 2201/10151* (2013.01)

(58) Field of Classification Search
CPC ... G02F 2001/136218; G02F 2201/121; G02F 2201/123; G02F 1/133345; G06F 3/0416; G06F 3/044; G06F 3/0412; H05K 1/0274; H05K 2201/10151; H05K 2201/0326
See application file for complete search history.

(56) References Cited

U.S. PATENT DOCUMENTS

| | | | |
|---|---|---|---|
| 6,724,012 B2 * | 4/2004 | Kimura | G02F 1/13454 257/72 |
| 6,795,049 B2 | 9/2004 | Toyoshima et al. | |
| 7,099,497 B2 | 8/2006 | Chou et al. | |
| 7,772,869 B2 * | 8/2010 | Lee | G09G 3/3648 324/760.01 |
| 8,000,789 B2 | 8/2011 | Denison | |
| 8,411,212 B2 | 4/2013 | Chiba et al. | |
| 8,970,549 B2 * | 3/2015 | Lee | G06F 3/0446 345/174 |
| 9,024,913 B1 | 5/2015 | Jung et al. | |
| 9,405,416 B2 | 8/2016 | Kang | |
| 9,588,617 B2 | 3/2017 | Chae | |
| 9,773,148 B2 * | 9/2017 | Mo | G06F 3/04166 |
| 9,904,407 B2 | 2/2018 | Hong et al. | |
| 10,025,970 B2 * | 7/2018 | Mizuhashi | G02F 1/134336 |
| 10,146,987 B2 * | 12/2018 | Mizuhashi | G06F 3/0443 |
| 2002/0093474 A1 * | 7/2002 | Toyoshima | G09G 3/3648 345/87 |
| 2003/0016024 A1 | 1/2003 | Teranuma et al. | |
| 2004/0247163 A1 | 12/2004 | Hara | |
| 2006/0109222 A1 | 5/2006 | Lee et al. | |
| 2008/0136980 A1 | 6/2008 | Rho et al. | |
| 2010/0302202 A1 | 12/2010 | Takeuchi et al. | |
| 2013/0135247 A1 | 5/2013 | Na et al. | |
| 2013/0287274 A1 * | 10/2013 | Shi | G06F 3/044 382/124 |
| 2014/0104228 A1 * | 4/2014 | Chen | G06F 3/0416 345/174 |
| 2014/0267165 A1 | 9/2014 | Roziere | |
| 2015/0309661 A1 | 10/2015 | Kim et al. | |
| 2016/0320886 A1 | 11/2016 | Kim et al. | |
| 2016/0320898 A1 | 11/2016 | Tang et al. | |
| 2017/0031506 A1 | 2/2017 | Cho et al. | |
| 2017/0045986 A1 | 2/2017 | Hong et al. | |

FOREIGN PATENT DOCUMENTS

| | | |
|---|---|---|
| TW | 201415124 A | 4/2014 |
| TW | 201503328 A | 1/2015 |
| TW | 201520844 A | 6/2015 |
| TW | 201528523 A | 7/2015 |

OTHER PUBLICATIONS

Office Action and English translation for related Taiwanese Application No. 105131883 dated Aug. 10, 2017.

* cited by examiner

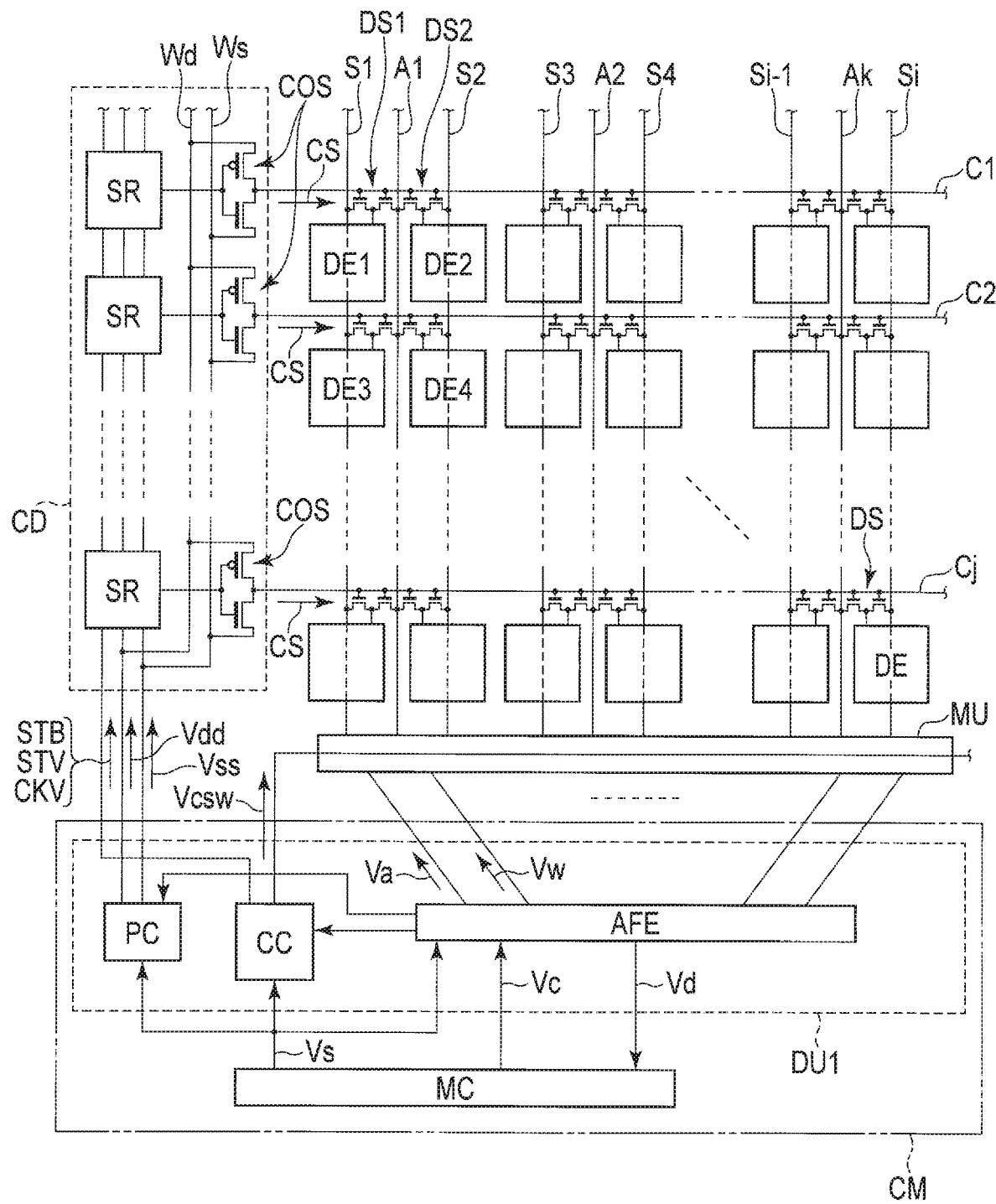
F I G. 6

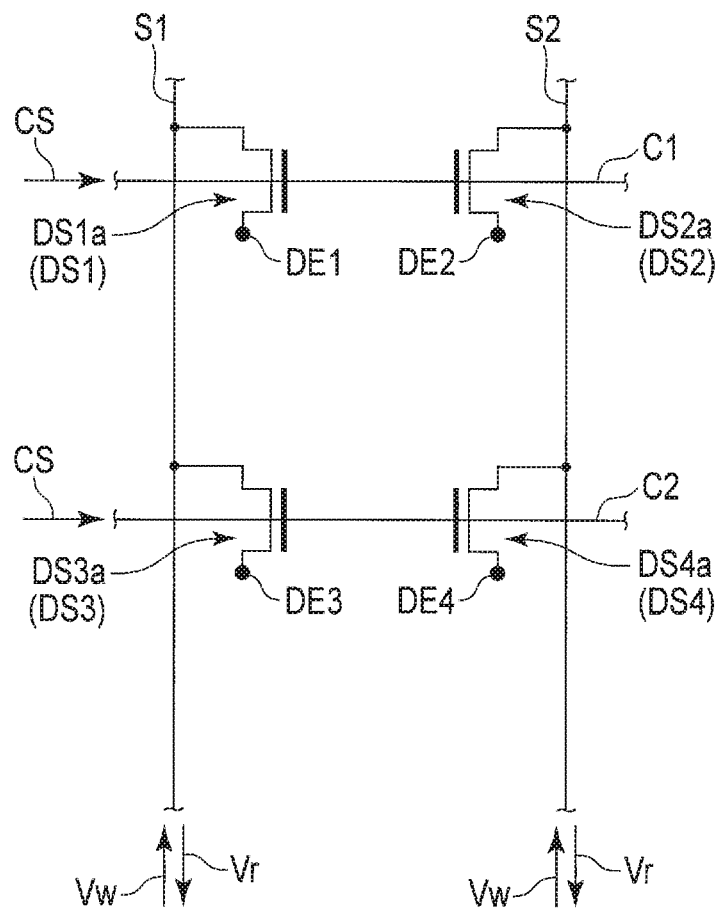
F I G. 10

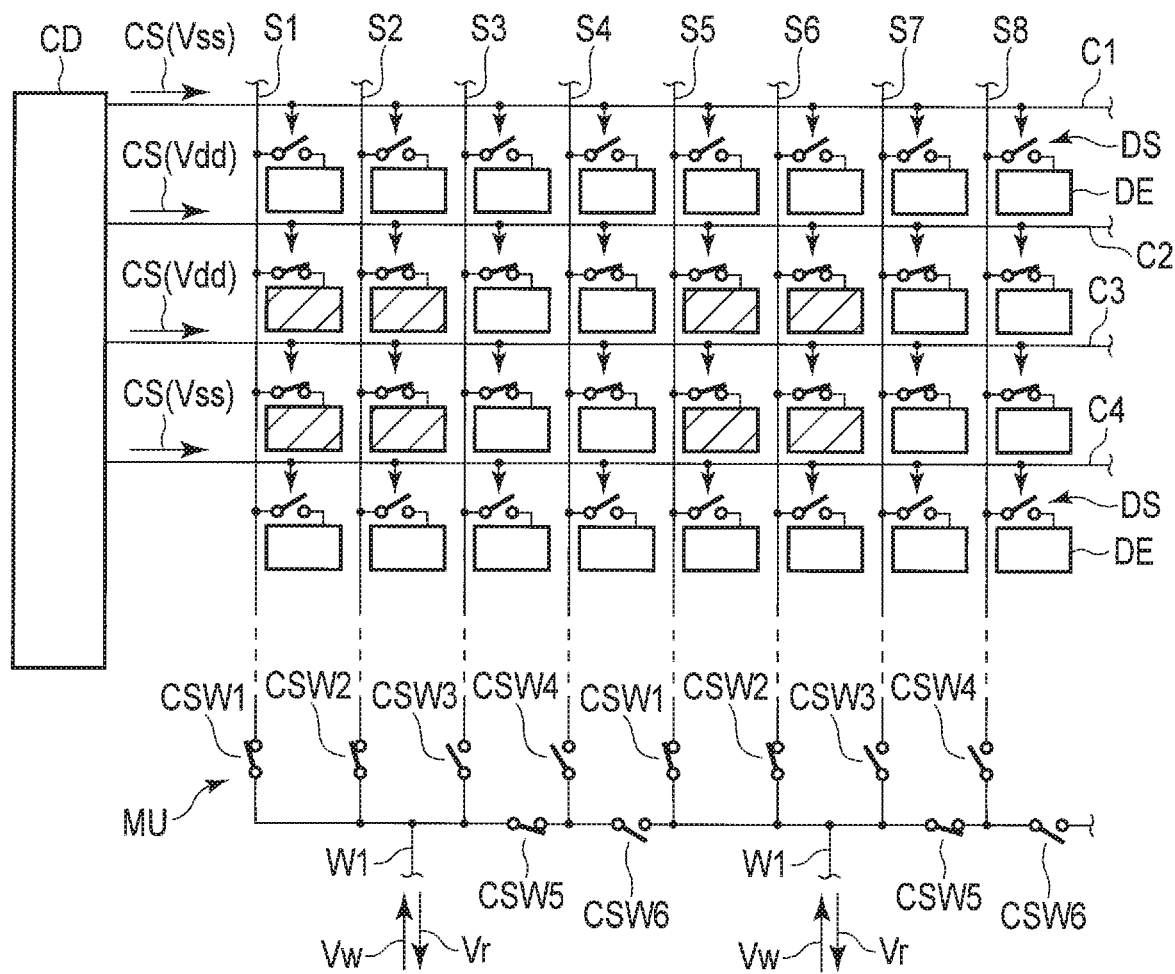
F I G. 17

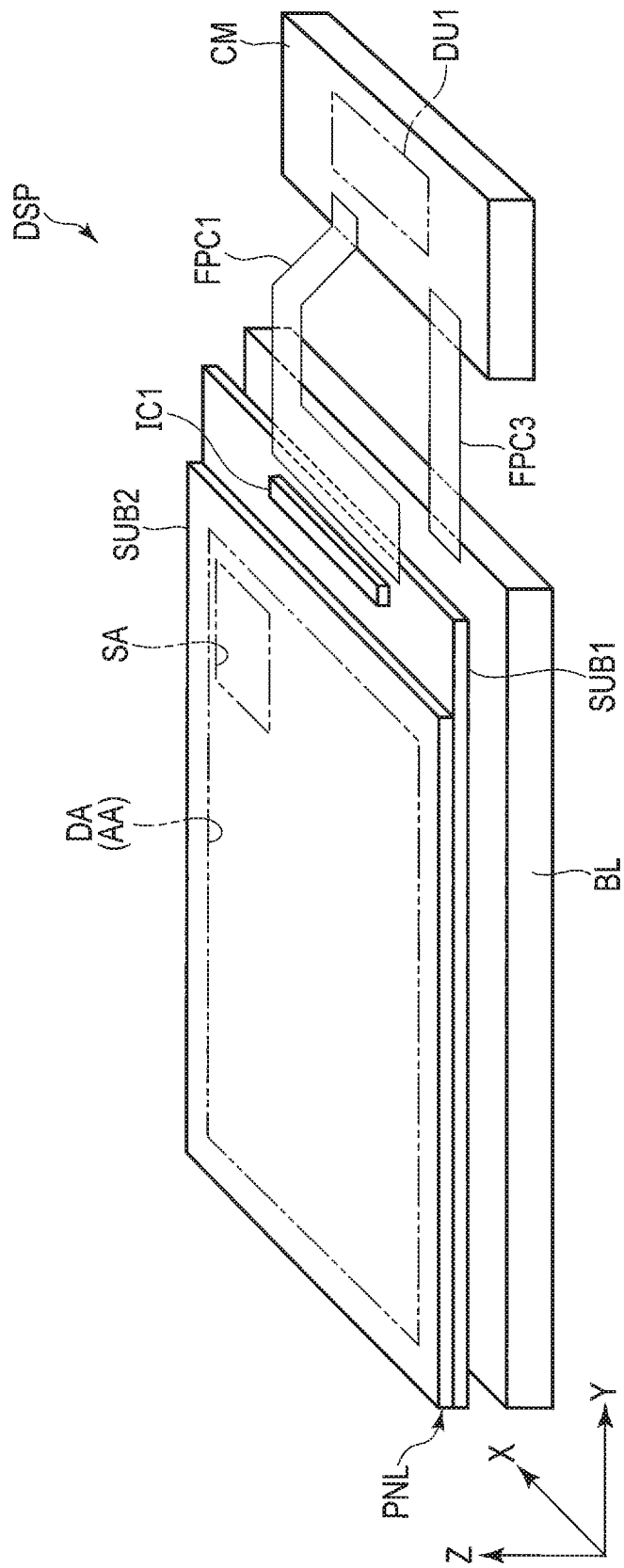
F I G. 18

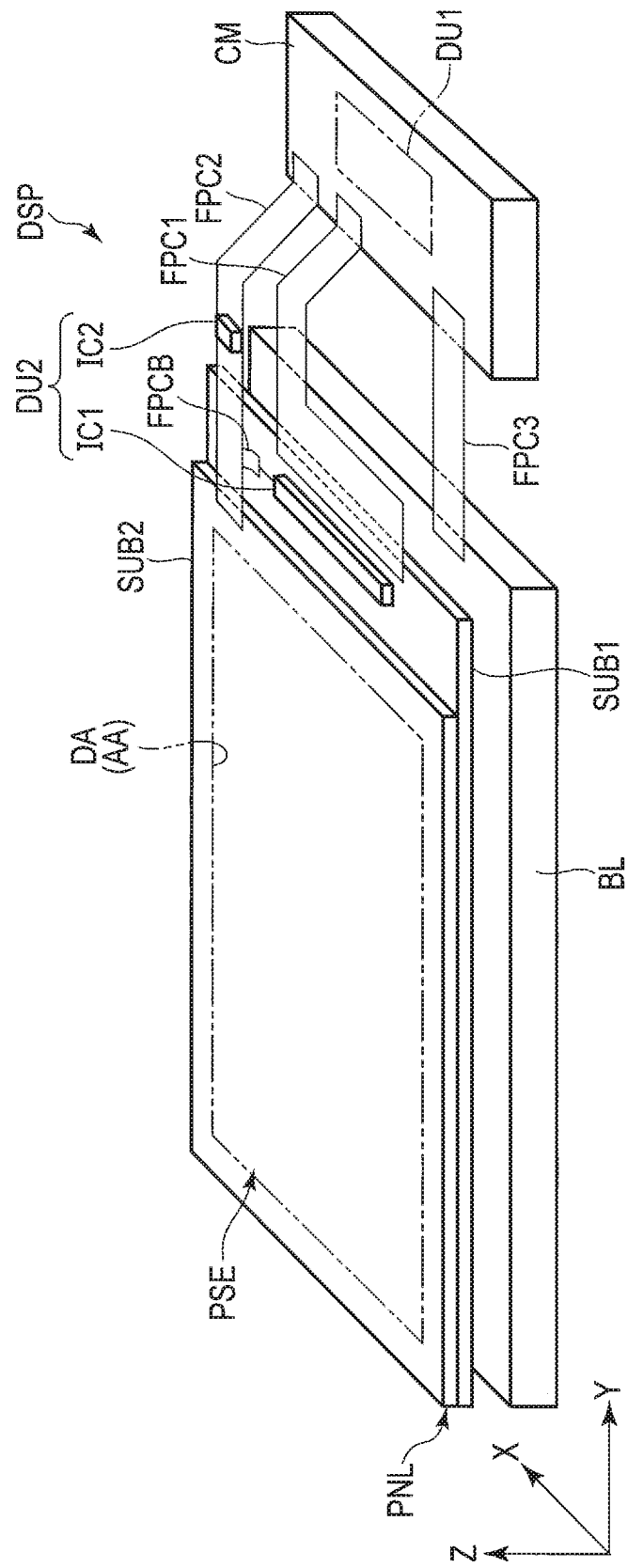
F I G. 20

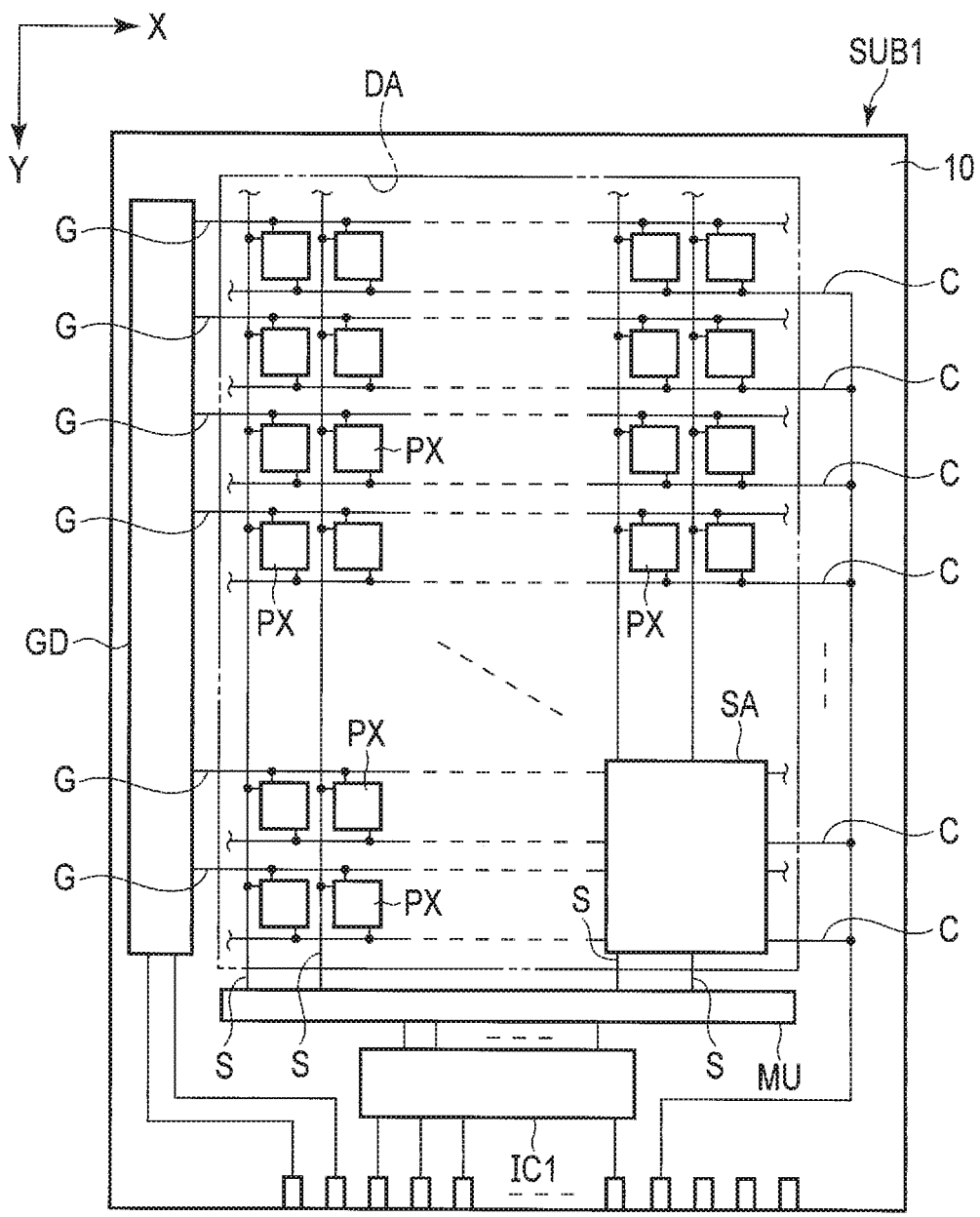
F I G. 23

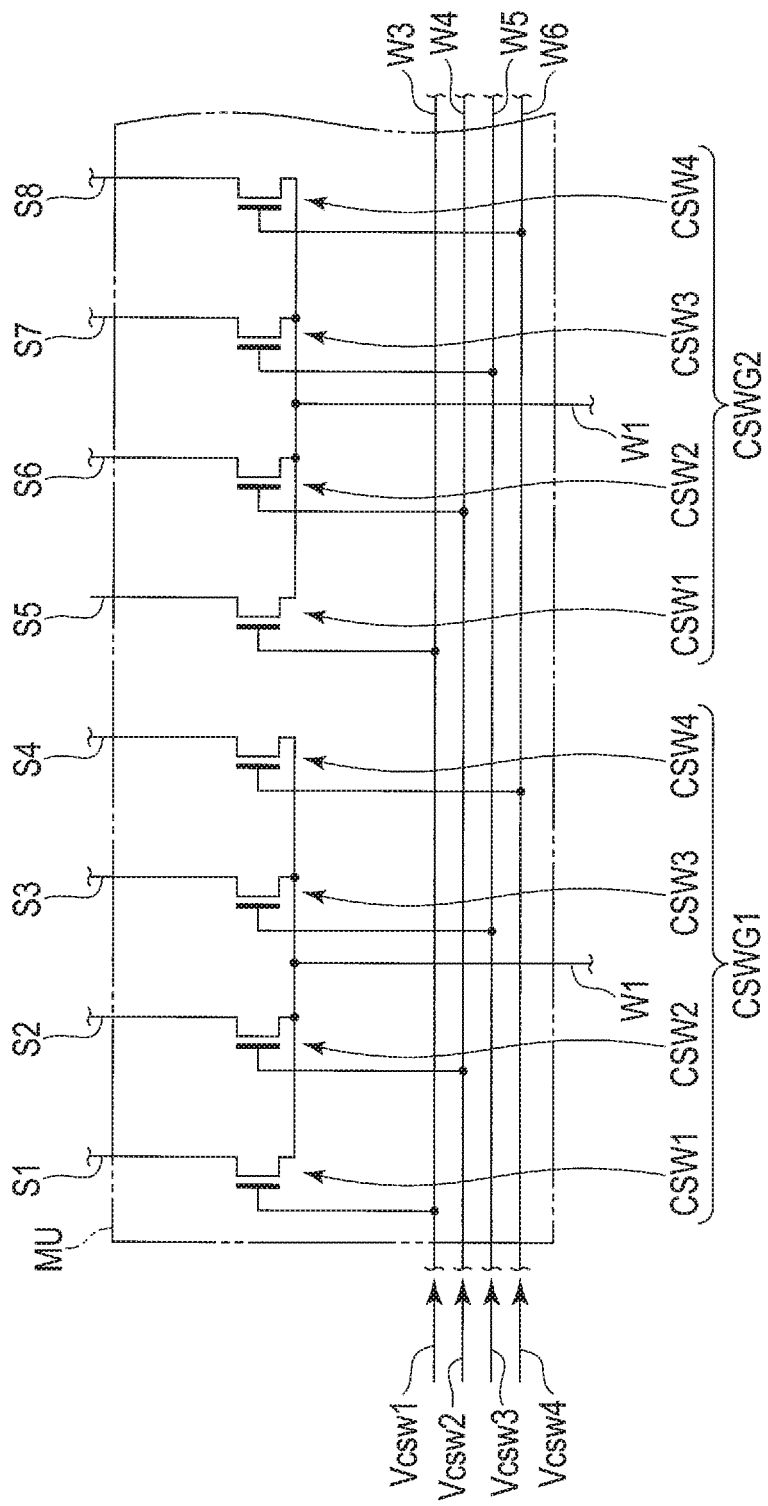
F I G. 24

SENSOR AND SENSOR-EQUIPPED DISPLAY DEVICE

CROSS-REFERENCE TO RELATED APPLICATIONS

The present application is a continuation of U.S. application Ser. No. 16/008,239, filed on Jun. 14, 2018, which is a continuation of U.S. application Ser. No. 15/285,064, filed on Oct. 4, 2016, which is based upon and claims the benefit of priority from Japanese Patent Application No. 2015-200807, filed Oct. 9, 2015, the entire contents of which is incorporated herein by reference.

FIELD

Embodiments described herein relate generally to a sensor and a sensor-equipped display device.

BACKGROUND

Recently, various types of sensors have been developed. For example, a sensor capable of detecting an uneven pattern (fingerprint) on a fingertip surface is well known.

SUMMARY

The present application generally relates to a sensor and a sensor-equipped display device.

In an embodiment, a sensor is provided. The sensor includes a first control line; a first signal line; a first detection switch connected to the first control line and the first signal line; a common electrode located above the first control line, the first signal line and the first detection switch, opposed to the first control line, the first signal line and the first detection switch, and including a first opening opposed to the first detection switch; a first detection electrode located above the common electrode, opposed to the first opening, and connected to the first detection switch through the first opening; a first circuit located under the common electrode, opposed to the common electrode, connected to the first control line, and supplying a drive signal to the first control line to change a state of the first detection switch to either of a first connection state of electrical connecting the first signal line and the first detection electrode to each other and a second connection state of electrical disconnecting the first signal line and the first detection electrode from each other; and a second circuit located under the common electrode, opposed to the common electrode and connected to the first signal line.

In another embodiment a sensor is provided. The sensor includes control lines extending in a row direction; signal lines extending in a columnar direction; detection switches each connected to one of the control lines and one of the signal lines; a common electrode located above the control lines, the signal lines and the detection switches, opposed to the control lines, the signal lines and the detection switches, and including openings, each of the openings being opposed to one of the detection switches; detection electrodes located above the common electrode, each opposed to the corresponding opening and connected to the corresponding detection switch through the opening; a first circuit located under the common electrode, opposed to the common electrode, connected to the control lines, supplying the drive signal to each of the control lines, and changing a state of each of the detection switches to either of a first connection state of electrical connecting the signal line and the detection electrode to each other and a second connection state of electrical disconnecting the signal line and the detection electrode from each other; a second circuit located under the common electrode, opposed to the common electrode, and connected to the signal lines; and a first detection unit supplying a potential adjustment signal to the common electrode and controlling the drive of the first circuit and the second circuit, the first detection unit simultaneously writing write signals to four detection electrodes located in an n-th row and an n+1-th row, of an m-th column and an m+1-th column, via the second circuit, two corresponding signal lines and four corresponding detection switches, reading read signals indicating variation of the write signals from the detection electrodes, respectively, and bundling the read signals into one signal, in a first sensing period in a sensing drive for performing sensing, the first detection unit simultaneously writing write signals to four detection electrodes located in an n-th row and an n+1-th row, of an m+1-th column and an m+2-th column, via the second circuit, two corresponding signal lines and four corresponding detection switches, reading read signals indicating variation of the write signals from the detection electrodes, respectively, and bundling the read signals into one signal, in a second sensing period in the sensing drive following the first sensing period, the potential adjustment signal being synchronized with the write signals and being equivalent in phase and amplitude to the write signals, in the sensing drive.

In yet another embodiment, a sensor-equipped display device is provided. The sensor-equipped display device includes a display panel, the display panel including control lines; signal lines; pixel switches each connected to one of the control lines and one of the signal lines; a common electrode disposed in a display area and an outside of the display area, located above the control lines, the signal lines and the pixel switches, opposed to the control lines, the signal lines and the pixel switches, and including openings, each of the openings being opposed to one of the pixel switches; pixel electrodes disposed in the display area and located above the common electrode, each of the pixel electrodes being opposed to the corresponding opening and connected to the corresponding pixel switch through the opening; a first circuit disposed outside the display area, located under the common electrode, opposed to the common electrode, connected to the control lines, supplying the drive signal to each of the control lines, and changing a state of each of the pixel switches to either of a first connection state of electrical connecting the signal line and the pixel electrode to each other and a second connection state of electrical disconnecting the signal line and the pixel electrode from each other; and a second circuit disposed outside the display area, located under the common electrode, opposed to the common electrode, and connected to the signal lines.

In yet a further embodiment, a sensor-equipped display device is provided. The sensor-equipped display includes a display panel, the display panel includes control lines; signal lines; pixel switches each connected to one of the control lines and one of the signal lines; pixel electrodes located in a display area and disposed above the control lines, the signal lines and the pixel switches; a detection electrode disposed above the control lines, the signal lines and the pixel switches; a first circuit disposed outside the display area, connected to the control lines, supplying a drive signal to each of the control lines, and changing a state of each of the pixel switches to either of a first connection state of electrical connecting the signal line and the pixel electrode to each other and a second connection state of electrical disconnecting the signal line and the pixel electrode from each other; and a second circuit disposed outside the display area and connected to the signal lines, the pixel electrodes and the detection electrode being disposed in a same layer.

Additional features and advantages are described herein, and will be apparent from the following Detailed Description and the figures.

BRIEF DESCRIPTION OF THE DRAWINGS

FIG. 6 is an equivalent circuit diagram showing an electrical connection in the sensor.

FIG. 10 is an equivalent circuit diagram showing an electrical connection between four pixels and various lines in a sensor of a second embodiment.

FIG. 17 is a circuit diagram for explanation of the example of the method of driving the sensor of the fourth embodiment, subsequent with FIG. 16.

FIG. 18 is a perspective view showing a configuration of a liquid crystal display device of a fifth embodiment.

FIG. 20 is a perspective view showing a configuration of a liquid crystal display device of a sixth embodiment.

FIG. 23 is a plan view showing a configuration of a first substrate in a liquid crystal display device of an eighth embodiment.

FIG. 24 is a circuit diagram showing a modified example of the multiplexer.

DETAILED DESCRIPTION

Figure 1:
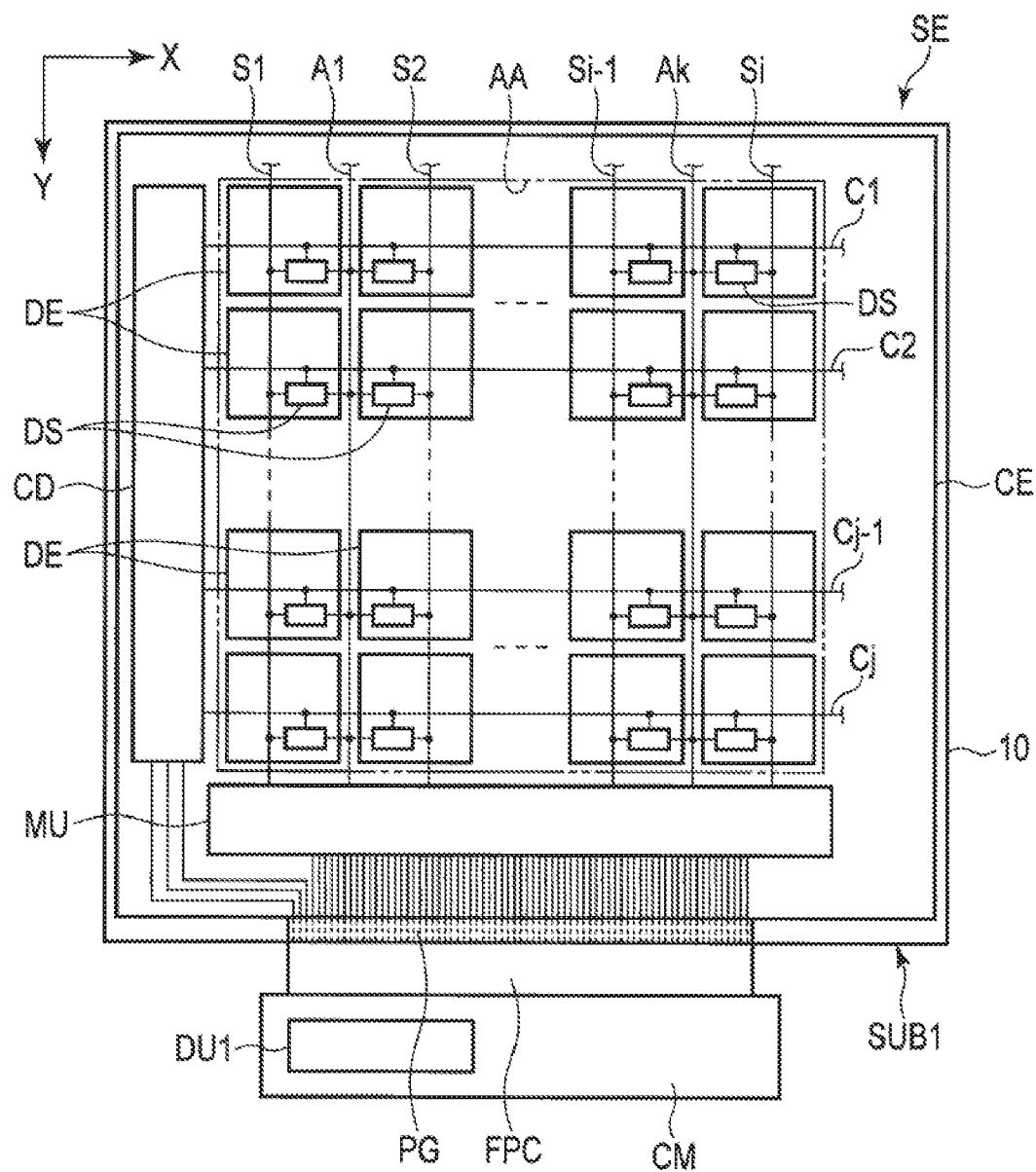
FIG. 1 is a plan view showing a sensor of a first embodiment.

In general, according to one embodiment, there is provided a sensor comprising: a first control line; a first signal line; a first detection switch connected to the first control line and the first signal line; a common electrode located above the first control line, the first signal line and the first detection switch, opposed to the first control line, the first signal line and the first detection switch, and including a first opening opposed to the first detection switch; a first detection electrode located above the common electrode, opposed to the first opening, and connected to the first detection switch through the first opening; a first circuit located under the common electrode, opposed to the common electrode, connected to the first control line, and supplying a drive signal to the first control line to change a state of the first detection switch to either of a first connection state of electrical connecting the first signal line and the first detection electrode to each other and a second connection state of electrical disconnecting the first signal line and the first detection electrode from each other; and a second circuit located under the common electrode, opposed to the common electrode and connected to the first signal line.

According to another embodiment, there is provided a sensor comprising: control lines extending in a row direction; signal lines extending in a columnar direction; detection switches each connected to one of the control lines and one of the signal lines; a common electrode located above the control lines, the signal lines and the detection switches, opposed to the control lines, the signal lines and the detection switches, and including openings, each of the openings being opposed to one of the detection switches; detection electrodes located above the common electrode, each opposed to the corresponding opening and connected to the corresponding detection switch through the opening; a first circuit located under the common electrode, opposed to the common electrode, connected to the control lines, supplying the drive signal to each of the control lines, and changing a state of each of the detection switches to either of a first connection state of electrical connecting the signal line and the detection electrode to each other and a second connection state of electrical disconnecting the signal line and the detection electrode from each other; a second circuit located under the common electrode, opposed to the common electrode, and connected to the signal lines; and a first detection unit supplying a potential adjustment signal to the common electrode and controlling the drive of the first circuit and the second circuit, the first detection unit simultaneously writing write signals to four detection electrodes located in an n-th row and an n+1-th row, of an m-th column and an m+1-th column, via the second circuit, two corresponding signal lines and four corresponding detection switches, reading read signals indicating variation of the write signals from the detection electrodes, respectively, and bundling the read signals into one signal, in a first sensing period in a sensing drive for performing sensing, the first detection unit simultaneously writing write signals to four detection electrodes located in an n-th row and an n+1-th row, of an m+1-th column and an m+2-th column, via the second circuit, two corresponding signal lines and four corresponding detection switches, reading read signals indicating variation of the write signals from the detection electrodes, respectively, and bundling the read signals into one signal, in a second sensing period in the sensing drive following the first sensing period, the potential adjustment signal being synchronized with the write signals and being equivalent in phase and amplitude to the write signals, in the sensing drive.

According to yet another embodiment, there is provided a sensor-equipped display device comprising a display panel, the display panel comprising: control lines; signal lines; pixel switches each connected to one of the control lines and one of the signal lines; a common electrode disposed in a display area and an outside of the display area, located above the control lines, the signal lines and the pixel switches, opposed to the control lines, the signal lines and the pixel switches, and including openings, each of the openings being opposed to one of the pixel switches; pixel electrodes disposed in the display area and located above the common electrode, each of the pixel electrodes being opposed to the corresponding opening and connected to the corresponding pixel switch through the opening; a first circuit disposed outside the display area, located under the common electrode, opposed to the common electrode, connected to the control lines, supplying the drive signal to each of the control lines, and changing a state of each of the pixel switches to either of a first connection state of electrical connecting the signal line and the pixel electrode to each other and a second connection state of electrical disconnecting the signal line and the pixel electrode from each other; and a second circuit disposed outside the display area, located under the common electrode, opposed to the common electrode, and connected to the signal lines.

According to yet another embodiment, there is provided a sensor-equipped display device comprising a display panel, the display panel comprising: control lines; signal lines; pixel switches each connected to one of the control lines and one of the signal lines; pixel electrodes located in a display area and disposed above the control lines, the signal lines and the pixel switches; a detection electrode disposed above the control lines, the signal lines and the pixel switches; a first circuit disposed outside the display area, connected to the control lines, supplying a drive signal to each of the control lines, and changing a state of each of the pixel switches to either of a first connection state of electrical connecting the signal line and the pixel electrode to each other and a second connection state of electrical disconnecting the signal line and the pixel electrode from each other; and a second circuit disposed outside the display area and connected to the signal lines, the pixel electrodes and the detection electrode being disposed in a same layer.

Embodiments will be described hereinafter with reference to the accompanying drawings. The disclosure is a mere example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like of the respective parts are illustrated schematically in the drawings, rather than as an accurate representation of what is implemented, but such schematic illustration is merely exemplary, and in no way restricts the interpretation of the invention. In the present specification and drawings, elements like or similar to those described in connection with preceding drawings are denoted by like reference numerals and their detailed description is omitted unless necessary.

First Embodiment

First, a sensor SE and a method of driving the sensor SE, of a first embodiment, will be described. FIG. 1 is a plan view showing the sensor SE of the first embodiment.

As shown in FIG. 1, the sensor SE comprises a plate-like first substrate SUB1, a control module CM, A flexible printed circuit FPC1 and the like. The first substrate SUB1 includes an active area AA. In the present embodiment, the active area AA is a detection area where an object is detected. The shape of the active area AA is a square, but is not particularly limited and may be a rectangle or a circle. The first substrate SUB1 includes a non-detection area of a rectangular frame shape outside the active area AA. The detected object is, for example, a conductive object such as a finger.

The first substrate SUB1 includes a first insulating substrate 10 such as a glass substrate or a resin substrate. Control lines C, signal lines S and auxiliary lines A are formed above the first insulating substrate 10.

The phrase "second member above the first member" indicates that the second member is not located on the first insulating substrate 10 side from the first member, but located on a side of a cover member CG which will be explained later from the first member. A second member may be in contact with the first member or may be located remote from the first member. In the latter case, a third member may be interposed between the first member and the second member.

The control lines C include j control lines such as a first control line C1, a second control line C2, . . . , and a j-th control line Cj. The control lines C extend in the first direction X and are arranged in a second direction Y intersecting the first direction X so as to be spaced apart from each other. Each control line C is shared by pixels for one row.

The signal lines S include i signal lines such as a first signal line S1, a second signal line S2, . . . , and an i-th signal line Si. The signal lines S extend in the second direction Y and are arranged in the first direction X so as to be spaced apart from each other. The signal lines S intersect the control lines C in the active area AA. Each signal line S is shared by pixels for one column.

The auxiliary lines A include k auxiliary lines such as a first auxiliary line A1, . . . and k-th auxiliary line Ak. The auxiliary lines A extend parallel to the signal lines S in the second direction Y and are arranged in the first direction X so as to be spaced apart from each other. The auxiliary lines A intersect the control lines C in the active area AA. Each auxiliary line A is shared by pixels for two adjacent columns.

In the present embodiment, the first direction X and the second direction Y can be restated as a row direction and a columnar direction, respectively. The first direction X and the second direction Y are orthogonal to each other, but may intersect at an angle other than 90°. The number of control lines C, signal lines S and auxiliary lines A is not particularly limited, but can be variously set. In this example, j represents 120, i represents 120 and k represents 60. For this reason, the number of control lines C is equal to the number of signal lines S while the number of auxiliary lines A is half the number of signal lines S.

Detection switches DS are formed near the intersections of the control lines C and the signal lines S. Each of the detection switches DS is connected to the control line C, the signal line S and the auxiliary line A.

The common electrode CE is located above the first insulating substrate 10, the control lines C, the signal lines S, the auxiliary lines A and the detection switches DS and opposed to the control lines C, the signal lines S, the auxiliary lines A and the detection switches DS. The common electrode CE is not only formed on the active area AA, but also extends to the outside of the active area AA. In the present embodiment, the common electrode CE is a single electrode, and the shape and the pattern of the common electrode CE are not particularly limited, but can be variously set. For example, the common electrode CE may be composed of electrodes arranged in stripes or electrodes arrayed in a matrix.

The detection electrodes DE are located above the common electrode CE. In the example illustrated, the detection electrodes DE are formed in a rectangular shape and arrayed in a matrix in the first direction X and the second direction Y, in the active area AA. In other words, the active area AA is an area where the detection electrodes DE are disposed. However, the shape of the detection electrode DE have been described by way of example, and are not limited to the rectangular shape. The number of detection electrodes DE is i×j. The detection electrodes DE are arrayed with, for example, a pitch of 50 μm in each of the first direction X and the second direction Y. In this case, the active area AA is a square having each side roughly 6 mm long.

The control line drive circuit CD serving as a first circuit is located between the first insulating substrate 10 and the common electrode CE. The control line drive circuit CD is located under the common electrode CE and opposed to the common electrode CE. The control line drive circuit CD is connected to the control lines C outside the active area AA. In contrast, the control line drive circuit CD is connected to an outer lead bonding (OLB) pad group PG disposed at one of end portions of the first insulating substrate 10 outside the active area AA. The control line drive circuit CD supplies drive signals to the control lines C to switch the state of the detection switches DS to either of a first connection state and a second connection state. The first connection state is a state in which the signal lines S and the detection electrodes DE are electrically connected while the auxiliary lines A and the detection electrodes DE are electrically disconnected. The second connection state is a state in which the signal lines S and the detection electrodes DE are electrically disconnected while the auxiliary lines A and the detection electrodes DE are electrically connected.

The phrase "second member under the first member" indicates that the second member is not located on the cover member CG side from the first member, but located on the first insulating substrate 10 side from the first member. A second member may be in contact with the first member or may be located remote from the first member. In the latter case, a third member may be interposed between the first member and the second member.

A multiplexer MU serving as a second circuit is located between the first insulating substrate 10 and the common electrode CE. The multiplexer MU is located under the common electrode CE and opposed to the common electrode CE. The multiplexer MU is connected to the signal lines S outside the active area AA. In contrast, the multiplexer MU is connected to the OLB pad group PG outside the active area AA. In the present embodiment, the multiplexer MU is a ¼ multiplexer. However, the multiplexer MU is not limited to a ¼ multiplexer, but can be variously modified and may be, for example, a ⅓ multiplexer. In the present embodiment, the auxiliary lines A are connected to the OLB pad group PG without intervention of the multiplexer MU since the second circuit is the multiplexer MU. According to the configuration of the second circuit, however, the auxiliary lines A may be connected to the OLB pad group PG via the second circuit.

As explained above, the common electrode CE is not opposed to the OLB pad group PG but opposed to the various lines, switches, circuits and the like formed above the first insulating substrate 10. Alternatively, the common electrode CE covers various lines, switches, circuits and the like. For this reason, the detection electrodes DE can be electrically shielded by the common electrode CE, not only inside the active area AA, but also outside the active area AA. In other words, degradation in sensor sensitivity can be suppressed since parasitic capacitance can hardly be generated at the detection electrodes DE.

The control module CM is connected to the OLB pad group PG of the first insulating substrate 10 via the flexible printed circuit FPC1. The control module CM can be restated as an application processor. The control module CM is connected to the control line drive circuit CD, the multiplexer MU and the like via the flexible printed circuit FPC1 and the like. The control module CM can control the drive of the control line drive circuit CD, the multiplexer MU and the like and synchronize the control line drive circuit CD with the multiplexer MU.

A cover member which will be explained later may be disposed above the first substrate SUB1. The cover member is opposed to the first substrate SUB1. For example, the size of the cover member is larger than the size of the first substrate SUB1, in view of the X-Y plane.

Figure 2:
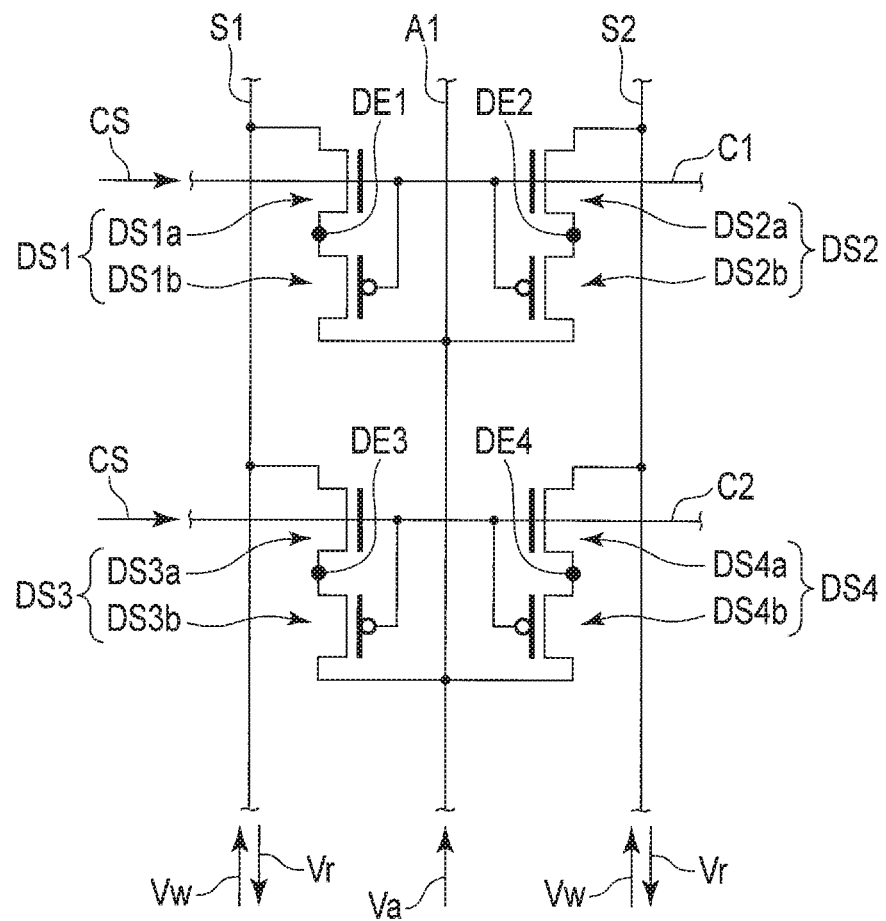
FIG. 2 is an equivalent circuit diagram showing an electrical connection between four pixels and various lines in the sensor shown in FIG. 1.

FIG. 2 is an equivalent circuit diagram showing an electrical connection between four pixels and various lines in the sensor SE shown in FIG. 1.

As shown in FIG. 2, each of the pixels comprises the detection switch DS, the detection electrode DE and the like. Each detection switch DS comprises a first switching element and a second switching element serially connected to each other. The first switching element and the second switching element are composed of, for example, thin-film transistors different in conduction type. In the present embodiment, the first switching element is composed of an N-channel thin-film transistor, and the second switching element is composed of a P-channel thin-film transistor. The first and second switching elements may be designed in a top gate type or a bottom gate type. A semiconductor layer of each of the first and second switching elements is formed of, for example, polycrystalline silicon (poly-Si), but may be formed of amorphous silicon, an oxide semiconductor or the like.

A first detection switch DS1 comprises a first switching element DS1$a$ and a second switching element DS1$b$. The first switching element DS1$a$ comprises a first electrode electrically connected to the first control line C1, a second electrode electrically connected to the first signal line S1, and a third electrode electrically connected to a first detection electrode DE1. The second switching element DS1$b$ comprises a first electrode electrically connected to the first control line C1, a second electrode electrically connected to the first auxiliary line A1, and a third electrode electrically connected to the first detection electrode DE1.

In each of the first switching element DS1$a$ and the second switching element DS1$b$, the first electrode functions as a gate electrode, either of the second electrode and the third electrode functions as a source electrode, and the other of the second electrode and the third electrode functions as a drain electrode. The third electrode of the first switching element DS1*a* is electrically connected to the third electrode of the second switching element DS1*b*. The functions of the first to third electrodes are similar to those in a second detection switch DS2, a third detection switch DS3, and a fourth detection switch DS4 which will be explained later.

The second detection switch DS2 comprises a first switching element DS2*a* and a second switching element DS2*b*. The first switching element DS2*a* comprises a first electrode electrically connected to the first control line C1, a second electrode electrically connected to the second signal line S2, and a third electrode electrically connected to a second detection electrode DE2. The second switching element DS2*b* comprises a first electrode electrically connected to the first control line C1, a second electrode electrically connected to the first auxiliary line A1, and a third electrode electrically connected to the second detection electrode DE2.

The third detection switch DS3 comprises a first switching element DS3*a* and a second switching element DS3*b*. The first switching element DS3*a* comprises a first electrode electrically connected to the second control line C2, a second electrode electrically connected to the first signal line S1, and a third electrode electrically connected to a third detection electrode DE3. The second switching element DS3*b* comprises a first electrode electrically connected to the second control line C2, a second electrode electrically connected to the first auxiliary line A1, and a third electrode electrically connected to the third detection electrode DE3.

The fourth detection switch DS4 comprises a first switching element DS4*a* and a second switching element DS4*b*. The first switching element DS4*a* comprises a first electrode electrically connected to the second control line C2, a second electrode electrically connected to the second signal line S2, and a third electrode electrically connected to a fourth detection electrode DE4. The second switching element DS4*b* comprises a first electrode electrically connected to the second control line C2, a second electrode electrically connected to the first auxiliary line A1, and a third electrode electrically connected to the fourth detection electrode DE4.

The connection of the detection switches DS to the signal lines S and the auxiliary lines A is not limited to the above-described example. For example, the second electrode of the first switching element of each detection switch DS may be connected to the auxiliary line A while the second electrode of the second switching element of each detection switch DS may be connected to the signal line S.

The control lines C such as the first control line C1 and the second control line C2 are driven by the control line drive circuit CD, and a drive signal CS is supplied from the control line drive circuit CD to each control line C. In the detection switch DS, either of the first switching element and second switching element is set in the on state and the other is set in the off state by the drive signal CS. Thus, the detection switch DS is changed to either of the first connection state and the second connection state.

The signal lines S such as the first signal line S1 and the second signal line S2 can be driven by the control module CM via the multiplexer MU. The control module CM is changed to either of the first mode and the second mode to control the first substrate SUB1 and perform sensing. More specifically, sensing is performed by a first detection unit DU1 of the control module CM. The present embodiment has, for example, an advantage of detecting a fine uneven pattern by the sensing. For example, the fine uneven pattern is a fingerprint (i.e., an uneven pattern on a finger surface). In some cases, the first mode is often called a self-capacitive sensing mode and the second mode is often called a mutual-capacitive sensing mode.

First, sensing in the first mode will be explained. It is assumed that, for example, the surface of a human finger is in contact with the cover member and is close to the active area AA of the first substrate SUB1.

In the first mode, the fingerprint is detected by writing a write signal Vw to each detection electrode DE and reading a read signal Vr from each detection electrode DE. When the first detection electrode DE1 is noticed, the first detection unit DU1 writes the write signal Vw to the first detection electrode DE1 via the multiplexer MU, the first signal line S1 and the first detection switch DS1 (first switching element DS1*a*) and reads the read signal Vr indicating the variation of the write signal Vw from the first detection electrode DE1 via the first detection switch DS1 (first switching element DS1*a*), the first signal line S1 and the multiplexer MU, in a state of supplying a drive signal CS to the first control line C1 and changing the first detection switch DS1 to the first connection state. This operation uses an effect that a coupling capacitance generated at the first detection electrode DE1 when a protruding portion of the fingerprint is opposed to the first detection electrode DE1 is different from a coupling capacitance generated at the first detection electrode DE1 when a recess portion of the fingerprint is opposed to the first detection electrode DE1.

As described above, the fingerprint can be detected by the sensing in the first mode. In the sensing, the common electrode CE can suppress the degradation in sensor sensitivity since the detection electrode DE can be electrically shielded by the common electrode CE as described above.

Furthermore, a potential adjustment signal Va is supplied to the auxiliary line A in the sensing in the first mode. The potential adjustment signal Va can be supplied to the common electrode CE via, for example, the auxiliary line A. Preferably, the potential adjustment signal Va is synchronized with the write signal Vw and is equivalent in phase and amplitude to the write signal Vw. For this reason, the write signal Vw and the potential adjustment signal Va are equivalent in the timing of changing to the high-level potential and the timing of changing to the low-level potential. The high-level potential and the low-level potential of the potential adjustment signal Va are not particularly limited. For example, if an amplitude of the write signal Vw (i.e., a difference between the high-level potential and the low-level potential of the write signal Vw) is Vp [V], the low-level potential of the potential adjustment signal Va can be set at 0 [V] and the high-level potential of the potential adjustment signal Va can be set at +Vp [V]. In addition, supplying the potential adjustment signal Va to the common electrode CE can be restated to supplying a variation in the potential of the write signal Vw to the common electrode CE.

For example, the timing of raising the potential of the detection electrode DE by 3 V by the write signal Vw can be made to match the timing of raising the potential of the common electrode CE by 3 V by the potential adjustment signal Va, and the timing of lowering the potential of the detection electrode DE by 3 V by the write signal Vw can be made to match the timing of lowering the potential of the common electrode CE by 3 V by the potential adjustment signal Va.

The variation in the potential difference between the common electrode CE and the detection electrode DE to which the write signal Vw is written can be suppressed in the sensing period. In addition, the variation in the potential difference between the common electrode CE and the signal line S by which the write signal Vw is supplied can be suppressed. For this reason, degradation in sensor sensitivity can be further suppressed.

Furthermore, the potential adjustment signal Va can be supplied to the third detection electrode DE3, the fourth detection electrode DE4 and the like, by changing the third detection switch DS3, the fourth detection switch DS4 and the like connected to the second control line C2 to the second connection state, in a period of changing the first detection switch DS1 and the like connected to the first control line C1 to the first connection state. The variation in the potential difference between the common electrode CE and the detection electrodes DE to which the potential adjustment signal Va is supplied can be therefore suppressed. Since the parasitic capacitance which can be coupled to the detection electrodes DE can be reduced, the degradation in sensor sensitivity can be further suppressed.

The first detection unit DU1 can adjust the signal and the power source voltage which are supplied to the first substrate SUB1, in the sensing in the first mode.

For example, the first detection unit DU1 supplies the power source voltage to the control line drive circuit CD but may superpose a superposition signal on each of the power source voltage and the drive signal CS at the period of sensing drive. In addition, the first detection unit DU1 supplies the control signal to the multiplexer MU but may superpose a superposition signal on the control signal at the period of sensing drive. The superposition signal is synchronized with the write signal Vw and is equivalent in phase and amplitude to the write signal Vw.

For this reason, the write signal Vw and the superposition signal are equivalent in the timing of changing to the high-level potential and the timing of changing to the low-level potential. In this example, superposing the superposition signal can be restated to superposing a variation in the potential of the write signal Vw.

For example, the timing of raising the potential of the detection electrode DE by 3 V by the write signal Vw can be made to match the timing of raising the potential of the control line C by 3 V by the drive signal CS, and the timing of lowering the potential of the detection electrode DE by 3 V by the write signal Vw can be made to match the timing of lowering the potential of the control line C by 3 V by the drive signal CS. The variation in the potential difference between the common electrode CE and the control line C to which the drive signal CS is supplied can be further suppressed in the sensing period. Besides, the variation in the potential difference between the common electrode CE and the control line drive circuit CD, and the variation in the potential difference between the common electrode CE and the multiplexer MU can be suppressed. The degradation in sensor sensitivity can be further suppressed since the parasitic capacitance which can be coupled to the common electrode CE, and the parasitic capacitance which can be coupled to the detection electrode DE can be reduced.

Next, sensing in the second mode will be explained. It is also assumed here that, for example, the surface of a finger is in contact with the cover member and is close to the active area AA of the first substrate SUB1.

In the second mode, the write signal Vw is written to a conductive member (not shown) located outside the active area AA, a sensor signal is generated between the conductive member and the detection electrode DE, and the read signal Vr indicating the variation in the sensor signal (for example, the electrostatic capacitance generated at the detection electrode DE) is received from the detection electrode DE. The fingerprint is thereby detected. One of examples of the conductive member is, for example, a member located outside the first substrate SUB1, disposed annually to surround the active area AA, and formed of a metal.

When the first detection electrode DE1 is noticed, the control module CM writes the write signal Vw to the conductive member and reads the read signal Vr from the first detection electrode DE1 via the first detection switch DS1 (first switching element DS1a), the first signal line S1 and the multiplexer MU, in a state of supplying the drive signal CS to the first control line C1 and changing the first detection switch DS1 to the first connection state.

As explained above, the fingerprint can be detected by the sensing in the second mode. In the sensing, the common electrode CE can suppress the degradation in sensor sensitivity since the detection electrode DE can be electrically shielded by the common electrode CE as described above.

Furthermore, the common electrode CE can be changed to an electrically floating state, in the sensing in the second mode. For example, the common electrode CE can be changed to an electrically floating state by changing all the auxiliary lines A to an electrically floating state. For example, the common electrode CE can be thereby set at a high impedance (Hi-Z).

The variation in the potential difference between the common electrode CE and the detection electrode DE can be suppressed in the sensing period. In addition, the variation in the potential difference between the common electrode CE and the signal line S by which the write signal Vw is supplied can be suppressed. Since the parasitic capacitance which can be coupled to the detection electrodes DE can be reduced, the degradation in sensor sensitivity can be further suppressed.

Alternatively, the common electrode CE can be set at a ground potential (GND) in the sensing in the second mode. For example, the common electrode CE can be set at the ground potential by fixing all the auxiliary lines A to the ground potential. In this case, too, the degradation in sensor sensitivity can be further suppressed since the parasitic capacitance which can be coupled to the detection electrodes DE can be reduced.

Figure 3:
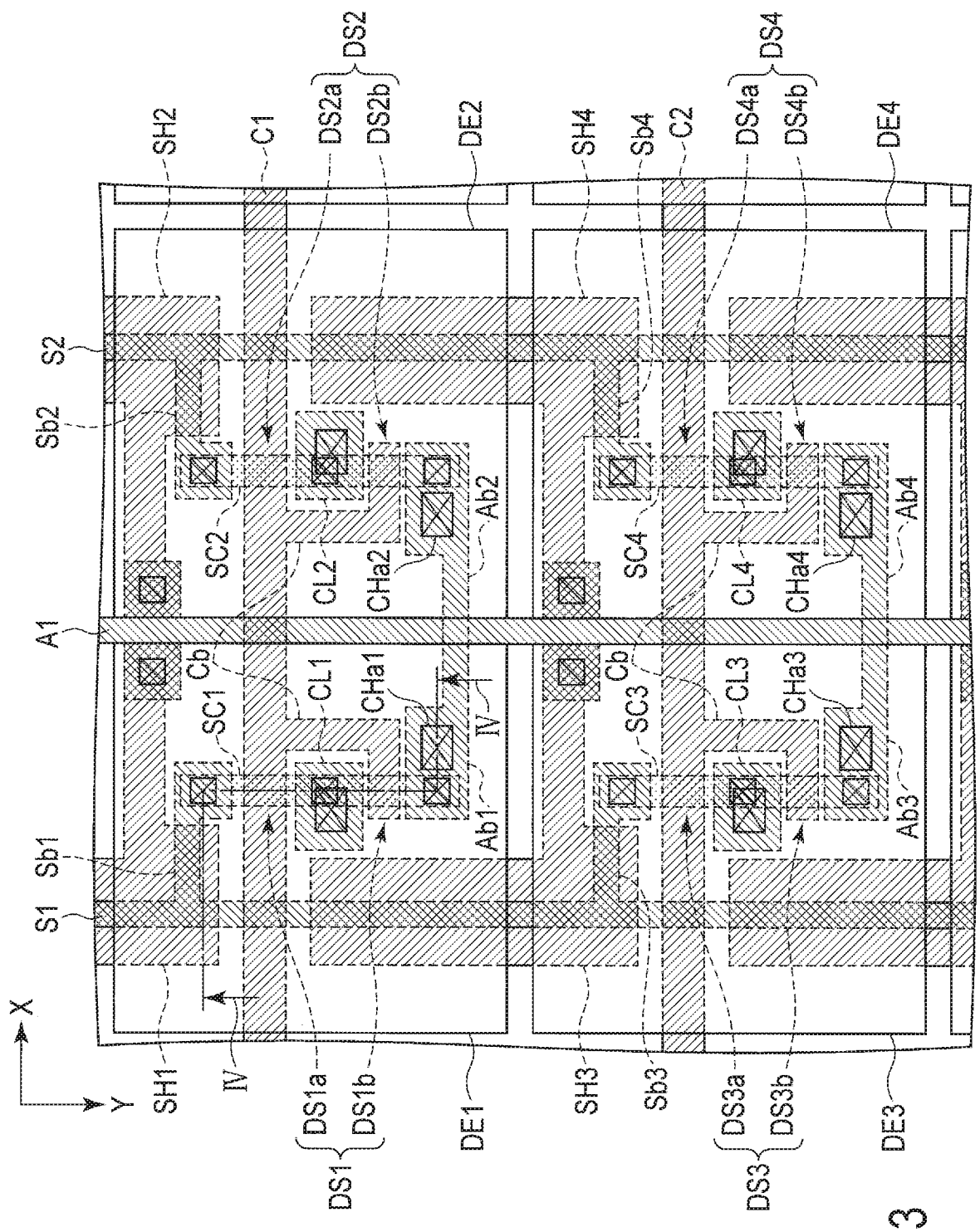
FIG. 3 is an enlarged plan view showing in part a first substrate shown in FIG. 1, illustrating four pixels and various lines shown in FIG. 2.

FIG. 3 is an enlarged plan view showing in part the first substrate SU1 shown in FIG. 1, illustrating four pixels and various lines shown in FIG. 2. FIG. 3 shows the first control line C1, the second control line C2, a first semiconductor layer SC1, a second semiconductor layer SC2, a third semiconductor layer SC3, a fourth semiconductor layer SC4, the first signal line S1, the second signal line S2, the first auxiliary line A1, a first conductive layer CL1, a second conductive layer CL2, a third conductive layer CL3, a fourth conductive layer CL4, a first shielding electrode SH1, a second shielding electrode SH2, a third shielding electrode SH3, a fourth shielding electrode SH4, the first detection electrode DE1, the second detection electrode DE2, the third detection electrode DE3, the fourth detection electrode DE4, and the like. Illustration of the common electrode CE is omitted in FIG. 3.

As shown in FIG. 3, the first control line C1 and the second control line C2 extend in the first direction X, and are arranged in the second direction Y so as to be spaced apart from each other. Branch portions Cb are disposed at each of the first control line C1 and the second control line C2. The branch portions Cb protrude from one of side edges of the first control line C1 or one of side edges of the second control line C2, in the second direction Y. In the present embodiment, the branch portions Cb are shaped in an L letter or a laterally reversed L letter in view of the X-Y plane in which the first control line C1 is located on an upper side and the second control line C2 is located on a lower side.

The first to fourth semiconductor layers SC1 to SC4 extend in the second direction Y. The first semiconductor layer SC1 and the second semiconductor layer SC2 intersect the first control line C1 at two points while the third semiconductor layer SC3 and the fourth semiconductor layer SC4 intersect the second control line C2 at two points. Each of the semiconductor layers SC includes channel regions at two points where the semiconductor layer SC intersects the control line C. Each of the semiconductor layers SC includes the channel region at the intersection of the main portion and the branch portion Cb of the control line C. The first detection switch DS1 comprises the first semiconductor layer SC1, the second detection switch DS2 comprises the second semiconductor layer SC2, the third detection switch DS3 comprises the third semiconductor layer SC3, and the fourth detection switch DS4 comprises the fourth semiconductor layer SC4.

The first signal line S1 and the second signal line S2 extend in the second direction Y and are arranged in the first direction X so as to be spaced apart from each other. Branch portions Sb are disposed at each of the first signal line S1 and the second signal line S2. The branch portions Sb protrude from one of side edges of the first signal line S1, in the first direction X, or from one of side edges of the second signal line S2, in a direction opposite to the first direction X. For example, the first signal line S1 includes a branch portion Sb1 which is opposed to the end portion of the first semiconductor layer SC1 and connected to the end portion, and a branch portion Sb3 which is opposed to the end portion of the third semiconductor layer SC3 and connected to the end portion. The second signal line S2 includes a branch portion Sb2 which is opposed to the end portion of the second semiconductor layer SC2 and connected to the end portion, and a branch portion Sb4 which is opposed to the end portion of the fourth semiconductor layer SC4 and connected to the end portion.

The first auxiliary line A1 extend in the second direction Y. The branch portions Ab are disposed at the first auxiliary line A1. A first branch portion Ab1 of the protruding portions of the first auxiliary line A1 protrudes from one of side edges of the first auxiliary line A1 in a direction opposite to the first direction X, and is opposed to the other end portion of the first semiconductor layer SC1 and connected to the other end portion. A second branch portion Ab2 protrudes from the other side edge of the first auxiliary line A1 in the first direction X, and is opposed to the other end portion of the second semiconductor layer SC2 and connected to the other end portion. A third branch portion Ab3 protrudes from one of the side edges of the first auxiliary line A1 in the direction opposite to the first direction X, and is opposed to the other end portion of the third semiconductor layer SC3 and connected to the other end portion. A fourth branch portion Ab4 protrudes from the other side edge of the first auxiliary line A1 in the first direction X, and is opposed to the other end portion of the fourth semiconductor layer SC4 and connected to the other end portion.

The first conductive layer CL1 is opposed to the first semiconductor layer SC1 and connected to the first semiconductor layer SC1 at a position between the channel regions of the first semiconductor layer SC1. The second conductive layer CL2 is opposed to the second semiconductor layer SC2 and connected to the second semiconductor layer SC2 at a position between the channel regions of the second semiconductor layer SC2. The third conductive layer CL3 is opposed to the third semiconductor layer SC3 and connected to the third semiconductor layer SC3 at a position between the channel regions of the third semiconductor layer SC3. The fourth conductive layer CL4 is opposed to the fourth semiconductor layer SC4 and connected to the fourth semiconductor layer SC4 at a position between the channel regions of the fourth semiconductor layer SC4.

The common electrode CE is connected to the auxiliary lines A at plural positions. For example, the common electrode CE is connected to the first to fourth branch portions Ab1 to Ab4 of the first auxiliary line A1 through contact holes CHa (CHa1, CHa2, CHa3 and CHa4). Thus, the common electrode CE may be connected to the auxiliary lines A in the respective pixels, and can thereby contribute to uniformity in the electrical potential of the common electrode CE in the entire area of the common electrode CE.

The first to fourth shielding electrodes SH1 to SH4 extend in the second direction Y and are connected to the first auxiliary line A1. The first to fourth shielding electrodes SH1 to SH4 are opposed to the branch portions Ab of the first auxiliary line A1 and connected to the branch portions Ab. The first shielding electrode SH1 is opposed to not only a part of the first signal line S1, but also the branch portion Sb1 of the first signal line S1 which protrudes toward the first semiconductor layer SC1 side. The second shielding electrode SH2 is opposed to not only a part of the second signal line S2, but also the branch portion Sb2 of the second signal line S2 which protrudes toward the second semiconductor layer SC2 side. The third shielding electrode SH3 is opposed to not only a part of the first signal line S1, but also the branch portion Sb3 of the first signal line S1 which protrudes toward the third semiconductor layer SC3 side. The fourth shielding electrode SH4 is opposed to not only a part of the second signal line S2, but also the branch portion Sb4 of the second signal line S2 which protrudes toward the fourth semiconductor layer SC4 side.

The first to fourth detection electrodes DE1 to DE4 are formed in a rectangular shape and arrayed in a matrix in the first direction X and the second direction Y.

The first detection electrode DE1 is opposed to the first control line C1, the first semiconductor layer SC1, the first signal line S1, the branch portion Ab1 of the first auxiliary line A1, the first conductive layer CL1, the first shielding electrode SH1, the third shielding electrode SH3 and the like, and connected to the first conductive layer CL1.

The second detection electrode DE2 is opposed to the first control line C1, the second semiconductor layer SC2, the second signal line S2, the branch portion Ab2 of the first auxiliary line A1, the second conductive layer CL2, the second shielding electrode SH2, the fourth shielding electrode SH4 and the like, and connected to the second conductive layer CL2.

The third detection electrode DE3 is opposed to the second control line C2, the third semiconductor layer SC3, the first signal line S1, the branch portion Ab3 of the first auxiliary line A1, the third conductive layer CL3, the third shielding electrode SH3 and the like, and connected to the third conductive layer CL3.

The fourth detection electrode DE4 is opposed to the second control line C2, the fourth semiconductor layer SC4, the second signal line S2, the branch portion Ab4 of the first auxiliary line A1, the fourth conductive layer CL4, the fourth shielding electrode SH4 and the like, and connected to the fourth conductive layer CL4.

The first auxiliary line A1 is located between the pixels on the left side and the pixels on the right side, in view of the X-Y plane in which the first control line C1 is located on an upper side and the second control line C2 is located on a lower side. In addition, the first auxiliary line A1 is located between adjacent pixels. The pixels on the left side and the pixels on the right side share the first auxiliary line A1. The pixels on the left side and the pixels on the right side can be formed symmetrically with respect to the first auxiliary line A1 and can contribute to enhancement in high definition of the pixels.

Figure 4:
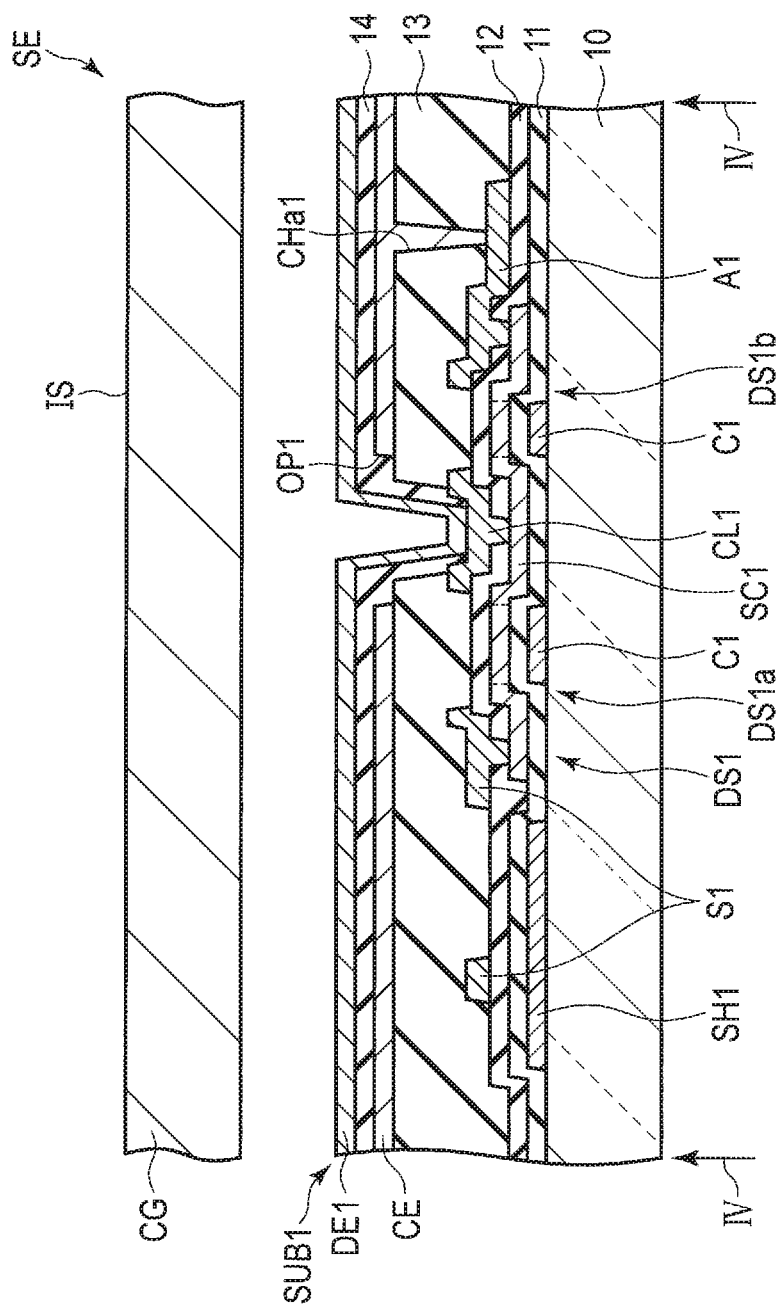
FIG. 4 is a cross-sectional view showing the first substrate seen along line IV-IV of FIG. 3.

FIG. 4 is a schematically cross-sectional view showing the first substrate SUB1 seen along line IV-IV of FIG. 3. FIG. 4 shows not only the first substrate SUB1, but also the cover member CG.

As shown in FIG. 4, the first control line C1 and the first shielding electrode SH1 are located above the first insulating substrate 10. The first control line C1 and the first shielding electrode SH1 are located above the first insulating substrate 10, in the present embodiment, but the formation is not limited to this. For example, the first control line C1 and the first shielding electrode SH1 may be located on an insulating film disposed on the first insulating substrate 10. The first control line C1 and the first shielding electrode SH1 are located on a side opposite to the first detection electrode DE1 with respect to the common electrode CE. The first control line C1 and the first shielding electrode SH1 are formed of the same conductive material, for example, a metal.

A first insulating film 11 is located on the first insulating substrate 10, the first control line C1 and the first shielding electrode SH1. The first semiconductor layer SC1 is located on the first insulating film 11. The first semiconductor layer SC1 includes two channel regions opposed to the first control line C1. The first semiconductor layer SC1 is located on a side opposite to the first detection electrode DE1 with respect to the common electrode CE. The first semiconductor layer SC1 is formed of, for example, poly-Si. The second insulating film 12 is located on the first insulating film 11 and the semiconductor layer SC1.

The first signal line S1, the first conductive layer CL1, and the first auxiliary line A1 are located on the second insulating film 12. The first signal line S1, the first conductive layer CL1, and the first auxiliary line A1 are located on a side opposite to the first detection electrode DE1 with respect to the common electrode CE. The first signal line S1, the first conductive layer CL1, and the first auxiliary line A1 are formed of the same conductive material, for example, a metal.

The first signal line S1 is located above the first shielding electrode SH1 and opposed to the first shielding electrode SH1. For this reason, the first shielding electrode SH1 is located on a side opposite to the common electrode CE with respect to the first signal line S1. The first signal line S1 is connected to an end portion of the first semiconductor layer SC1 through a contact hole formed in the second insulating film 12.

The first shielding electrode SH1 can be disposed below the first signal line S1 while the common electrode CE is disposed above the first signal line S1. The degradation in sensor sensitivity can be suppressed since the detection electrodes DE can be further shielded electrically by the first shielding electrode SH1.

The first detection unit DU1 can supply the potential adjustment signal Va to the first shielding electrode SH1 via the first auxiliary line A1. Since variation in the potential difference between the first shielding electrode SH1 and the common electrode CE can be suppressed, the degradation in sensor sensitivity can be further suppressed.

The first conductive layer CL1 is connected between the channel regions of the first semiconductor layer SC1 through a contact hole formed in the second insulating film 12. The first auxiliary line A1 is connected to the other end portion of the first semiconductor layer SC1 through a contact hole formed in the second insulating film 12.

The third insulating film 13 is located on the second insulating film 12, the first signal line S1, the first conductive layer CL1, and the first auxiliary line A1. The third insulating film 13 includes a contact hole opposed to the first conductive layer CL1 and opened in the first conductive layer CL1.

As described above, the first insulating substrate 10 is composed of not a silicon substrate, but a glass substrate or a resin substrate. The third insulating film 13 can be formed of an organic material while the first insulating film 11, the second insulating film 12, and a fourth insulating film 14 which will be explained later are formed of an inorganic material. The organic material is a material suitable to increase the film thickness, and acrylic resin can be used as the organic material. The thickness of the third insulating film 13 can be increased by using the organic material as compared with using an inorganic material, and the parasitic capacitance between the conductive members such as the common electrode CE and the first detection electrode DE1, which are located on the upper side than the third insulating film 13, and the conductive members such as the first shielding electrode SH1, the first control line C1 and the first signal line S1, which are located on the lower side than the third insulating film 13, can be thereby reduced.

The common electrode CE is located on the third insulating film 13. The common electrode CE is connected to the first auxiliary line A1 through the contact hole CHa1 formed in the third insulating film 13. The common electrode CE includes a first opening OP1 which is opposed to the first detection switch DS1 and surrounds the contact hole of the third insulating film 13. The common electrode CE includes not only the first opening OP1, but also plural openings. For example, the common electrode CE also includes a second opening opposed to the second detection switch DS2, a third opening opposed to the third detection switch DS3, and a fourth opening opposed to the fourth detection switch DS4.

The common electrode CE is formed of a transparent conductive material such as indium tin oxide (ITO), indium zinc oxide (IZO) or zinc oxide (ZnO). However, the material of the common electrode CE is not limited to a transparent conductive material, but a metal may be used instead of the transparent conductive material.

The fourth insulating film 14 is located on the first conductive film CL1, the third insulating film 13 and the common electrode CE. The fourth insulating film 14 is opposed to the first conductive layer CL1 and includes a contact hole opened in the first conductive layer CL1.

The first detection electrode DE1 is located on the fourth insulating layer 14 and opposed to the first opening OP1. The first detection electrode DE1 is connected to the first conductive layer CL1 through the first opening OP1 and the contact hole of the fourth insulating film 14. The first detection electrode DE1 may be formed of a transparent conductive material such as ITO, IZO or ZnO, similarly to the common electrodes CE, but may be formed of a metal instead of the transparent conductive material.

The sensor SE may be located above the first substrate SUB1 and comprise the cover member CG opposed to the first substrate SUB1. The cover member CG is formed of, for example, a glass substrate. In this case, the cover member CG is often called a cover glass. Alternately, the cover member CG can be formed by using a substrate having a light transmitting property such as a resin substrate. The cover member CG may be bonded to the first substrate SUB1 by an adhesive layer. An input surface IS of the sensor SE is the surface of the cover member CG. For example, when a finger contacts or approaches the input surface IS, the sensor SE can detect information of a fingerprint of the finger.

Figure 5:
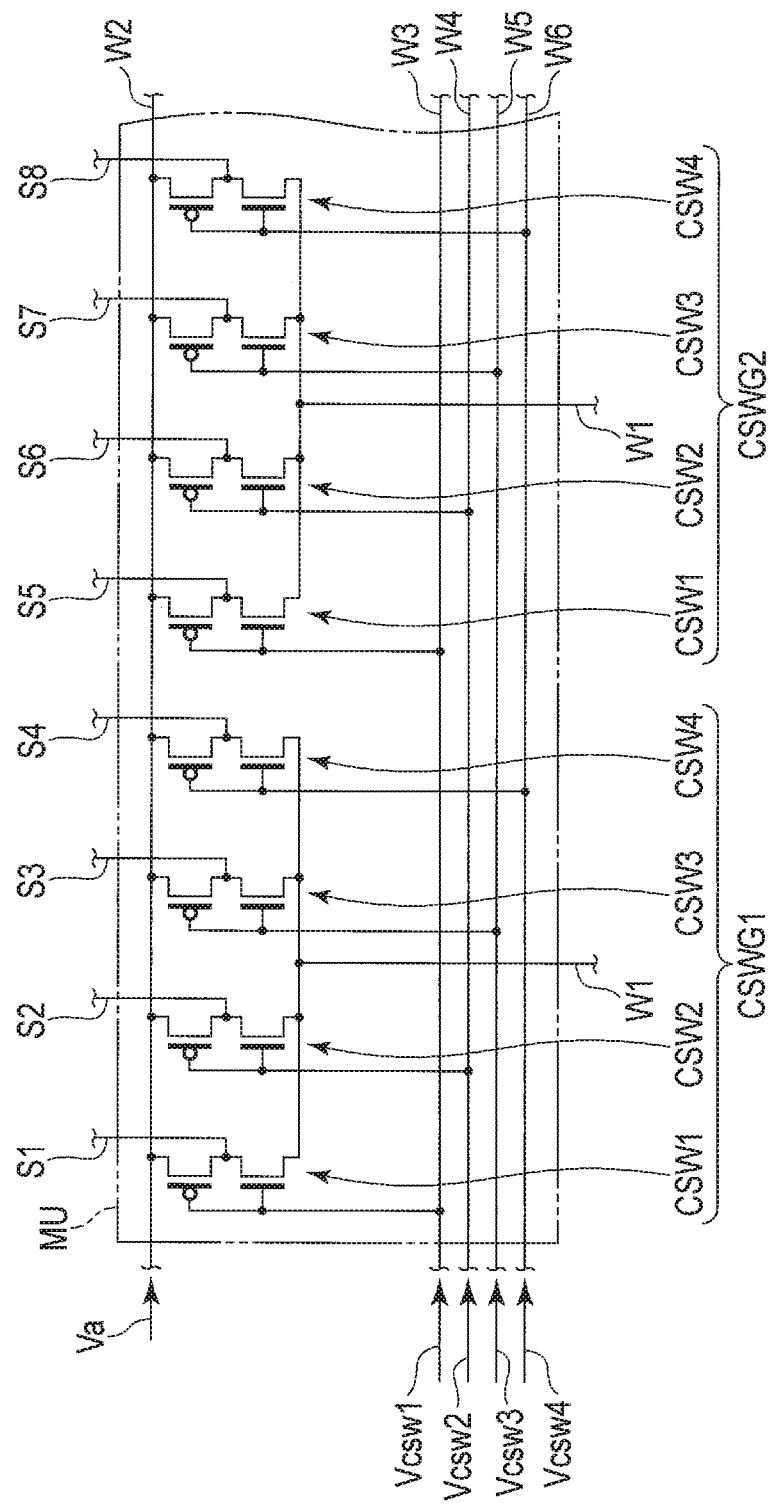
FIG. 5 is an enlarged plan view showing in part an outside of an active area of the first substrate, illustrating a circuit diagram of a multiplexer.

FIG. 5 is an enlarged plan view showing in part the outside of the active area AA of the first substrate SUB1, illustrating the multiplexer MU.

As shown in FIG. 5, the multiplexer MU comprises control switch groups CSWG. The control switch groups CSWG includes a first control switch group CSWG1, a second control switch group CSWG2, and the like. Each of the control switch groups CSWG includes control switches CSW. In the present embodiment, the multiplexer MU is a ¼ multiplexer, and each control switch group CSWG includes four control switches, i.e., a first control switch CSW1, a second control switch CSW2, a third control switch CSW3, and a fourth control switch CSW4.

The multiplexer MU is connected to the signal lines S. In addition, the multiplexer MU is connected to the control module CM via connection lines W1, one connection line W2, and four control lines W3, W4, W5, and W6. The number of connection lines W1 is a quarter of the number of the signal lines S. As mentioned above, the number of connection lines W1 is thirty since the number of the signal lines S is one hundred and twenty.

Each control switch CSW comprises two switching elements which are serially connected to each other. Two switching elements are composed of, for example, thin-film transistors different in conduction type. In the present embodiment, each control switch CSW is composed of a P-channel thin-film transistor and an N-channel thin-film transistor which are serially connected to each other.

A first electrode of each thin-film transistor of the first control switch CSW1 is connected to the control line W3, a first electrode of each thin-film transistor of the second control switch CSW2 is connected to the control line W4, a first electrode of each thin-film transistor of the third control switch CSW3 is connected to the control line W5, and a first electrode of each thin-film transistor of the fourth control switch CSW4 is connected to the control line W6.

A second electrode of the P-channel thin-film transistor of each control switch CSW is connected to the connection line W2.

Second electrodes of N-channel thin-film transistors of the first control switch group CSWG1 are connected to the same connection line W1, and second electrodes of N-channel thin-film transistors of the second control switch group CSWG2 are connected to the same connection line W1.

A third electrode of each thin-film transistor of the first control switch CSW1 of the first control switch group CSWG1 is connected to the first signal line S1. A third electrode of each thin-film transistor of the second control switch CSW2 of the first control switch group CSWG1 is connected to the second signal line S2. A third electrode of each thin-film transistor of the third control switch CSW3 of the first control switch group CSWG1 is connected to the third signal line S3. A third electrode of each thin-film transistor of the fourth control switch CSW4 of the first control switch group CSWG1 is connected to the fourth signal line S4.

A third electrode of each thin-film transistor of the first control switch CSW1 of the second control switch group CSWG2 is connected to the fifth signal line S5. A third electrode of each thin-film transistor of the second control switch CSW2 of the second control switch group CSWG2 is connected to the sixth signal line S6. A third electrode of each thin-film transistor of the third control switch CSW3 of the second control switch group CSWG2 is connected to the seventh signal line S7. A third electrode of each thin-film transistor of the fourth control switch CSW4 of the second control switch group CSWG2 is connected to the eighth signal line S8.

In each of the thin-film transistors of the multiplexer MU, the first electrode functions as a gate electrode, either of the second electrode and the third electrode functions as a source electrode, and the other of the second electrode and the third electrode functions as a drain electrode.

Control signals Vcsw1, Vcsw2, Vcsw3 and Vcsw4 are supplied from the first detection unit DU1 to the control lines W3, W4, W5, and W6, respectively. The first control switch CSW1 is changed to either of a first change state and a second change state by the control signal Vcsw1. The second control switch CSW2 is changed to either of the first change state and the second change state by the control signal Vcsw2. The third control switch CSW3 is changed to either of the first change state and the second change state by the control signal Vcsw3. The fourth control switch CSW4 is changed to either of the first change state and the second change state by the control signal Vcsw4.

The first change state indicates a state in which the connection line W1 is electrically connected to the signal lines S, and the second change state indicates a state in which the connection line W2 is electrically connected to the signal lines S. For this reason, the write signal Vw can be supplied to the signal lines S and the read signal Vr can be read from the detection electrodes DE, by changing each of the control switches CSW to be the first change state. In addition, the potential adjustment signal Va can be supplied to the signal lines S by changing each of the control switches CSW to be the second change state.

Writing of the write signal Vw to the detection electrodes DE and reading of the read signal Vr from the detection electrodes DE can be performed in time division, by controlling the timing of changing each of the control switches CSW of the multiplexer MU to either of the first change state and the second change state by the control signals Vcsw1, Vcsw2, Vcsw3 and Vcsw4, and the timing of changing each of the detection switches DS to either of the first connection state and the second connection state by the drive signal CS.

In addition, the potential adjustment signal Va can be supplied to each of the second to fourth signal lines S2 to S4 and the sixth to eighth signal lines S6 to S8 while the write signal Vw can be supplied to each of the first signal line S1 and the fifth signal line S5, in the same period, by using the above-explained multiplexer MU. Since variation in the potential difference between all the signal lines S and the common electrode CE can be suppressed, the degradation in sensor sensitivity can be further suppressed.

It should be noted that the sensor SE can use various types of conventionally known multiplexers (selector circuits) instead of the multiplexer MU, as the second circuit. For example, a ⅓ multiplexer can be used as the sensor SE.

FIG. 6 is an equivalent circuit diagram showing an electrical connection in the sensor SE.

As shown in FIG. 6, the control module CM comprises a main controller MC and a first detection unit DU1. The main controller MC is a central processing unit.

The main controller MC transmits the control signal Vc to an analog front end AFE and controls driving the analog front end AFE. The main controller MC receives a data signal Vd from the analog front end AFE. The data signal Vd is a signal based on the read signal Vr and, in this case, a signal obtained by converting the read signal Vr, which is an analog signal, into a digital signal. In addition, the main controller MC transmits the synchronization signal Vs to the analog front end AFE, a circuit control signal source CC, and a power source controller PC, to attempt synchronization of the driving of the analog front end AFE, the circuit control signal source CC and the power source controller PC. Examples of the synchronization signal Vs include a vertical synchronization signal TSVD and a horizontal synchronization signal TSHD.

The analog front end AFE transmits the potential adjustment signal Va and the write signal Vw to the multiplexer MU and receives the read signal Vr from the multiplexer MU. For example, the conversion of the read signal Vr into the digital signal is performed in the analog front end AFE. In addition, the analog front end AFE inputs a pulse signal (detection pulse) to be superposed to the circuit control signal source CC and the power source controller PC. The pulse signal is synchronized with the potential adjustment signal Va and is equivalent in phase and amplitude to the potential adjustment signal Va.

The circuit control signal source CC supplies the control signals Vcsw (Vcsw1, Vcsw2, Vcsw3 and Vcsw4) to the multiplexer MU and transmits a reset signal STB, a start pulse signal STV and a clock signal CKV to the control line drive circuit CD.

The power source controller PC supplies a high-potential power source voltage Vdd and a relatively low-potential power source voltage Vss to the control line drive circuit CD.

The control line drive circuit CD comprises shift registers SR and control switches COS connected to the shift registers SR in a one-to-one relationship. In addition, a high-potential power source line Wd to which the power source voltage Vdd is supplied and a low-potential power source line Ws to which the power source voltage Vss is supplied extend inside the control line drive circuit CD. Control switches COS are sequentially controlled via the shift register SR to be changed to a state of making electrical connection between the high-potential power source line Wd and the control lines C or a state of making electrical connection between the low-potential power source line Ws and the control lines C. In the present embodiment, the drive signal CS is the power source voltage Vdd or the power source voltage Vss.

Figure 7:
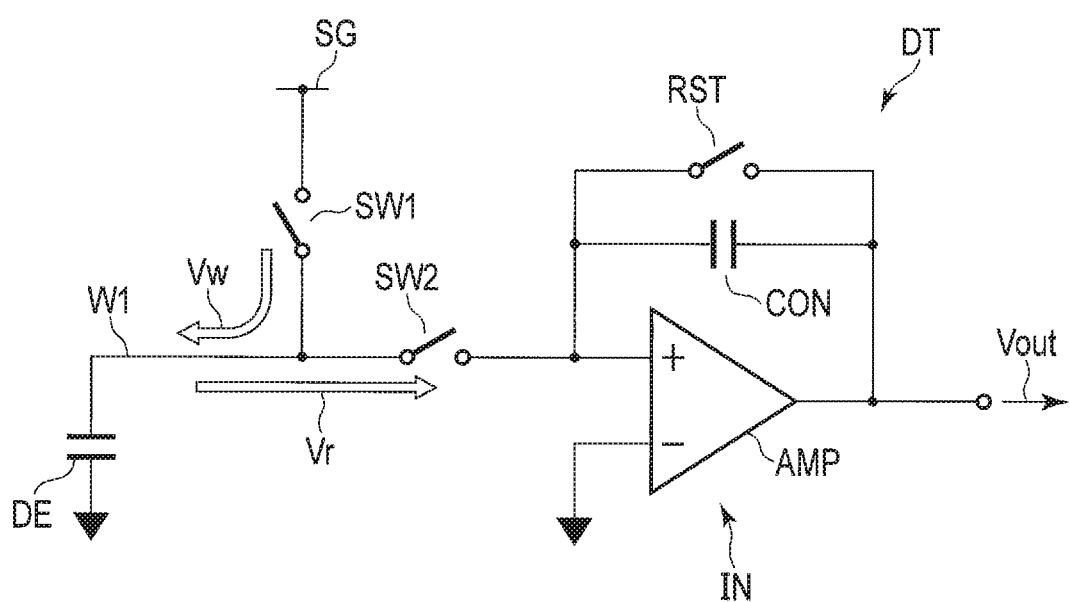
FIG. 7 is a circuit diagram showing a detector in the sensor.

FIG. 7 is a circuit diagram showing a detector DT in the sensor SE. In the present embodiment, the detectors DT are formed at the analog front end AFE shown in FIG. 6. It should be noted that the detectors DT are formed at the analog front end AFE. The number of the detectors DT is equal to, for example, the number of the connection lines W1. In this case, the detectors DT are connected to the connection lines W1, respectively.

As shown in FIG. 7, each detector DT comprises an integrator IN, a reset switch RST, a switch SW1 and a switch SW2. The integrator IN comprises an operational amplifier AMP and a capacitor CON. In the present example, the capacitor CON is connected between a output terminal and a noninverting input terminal of the operational amplifier AMP. The reset switch RST is connected parallel to the capacitor CON. The switch SW1 is connected between the signal source and the connection line W1. The switch SW1 switches whether to supply the write signal Vw from the signal source SG to the detection electrode DE via the connection line W1 or the like, and supplying no signal. The switch SW2 is connected between the connection line W1 and the noninverting input terminal of the operational amplifier AMP. The switch SW2 switches whether to input the read signal Vr to the noninverting input terminal.

When the above-explained detector DT is used, the switch SW1 is first on, the switch SW2 is off, and the write signal Vw is written to the detection electrode DE via the connection line W1 and the like. Next, after the switch SW1 is off, the switch SW2 is on, and the read signal Vr taken from the detection electrode DE via the connection line W1 and the like is input to the noninverting input terminal. The integrator IN integrates the input voltage (read signal Vr) by time. The integrator IN can thereby output a voltage proportional to the input voltage as an output signal Vout. After that, electric charges of the capacitor CON are discharged and the output signal Vout is reset, by turning off the reset switch RST.

Figure 8:
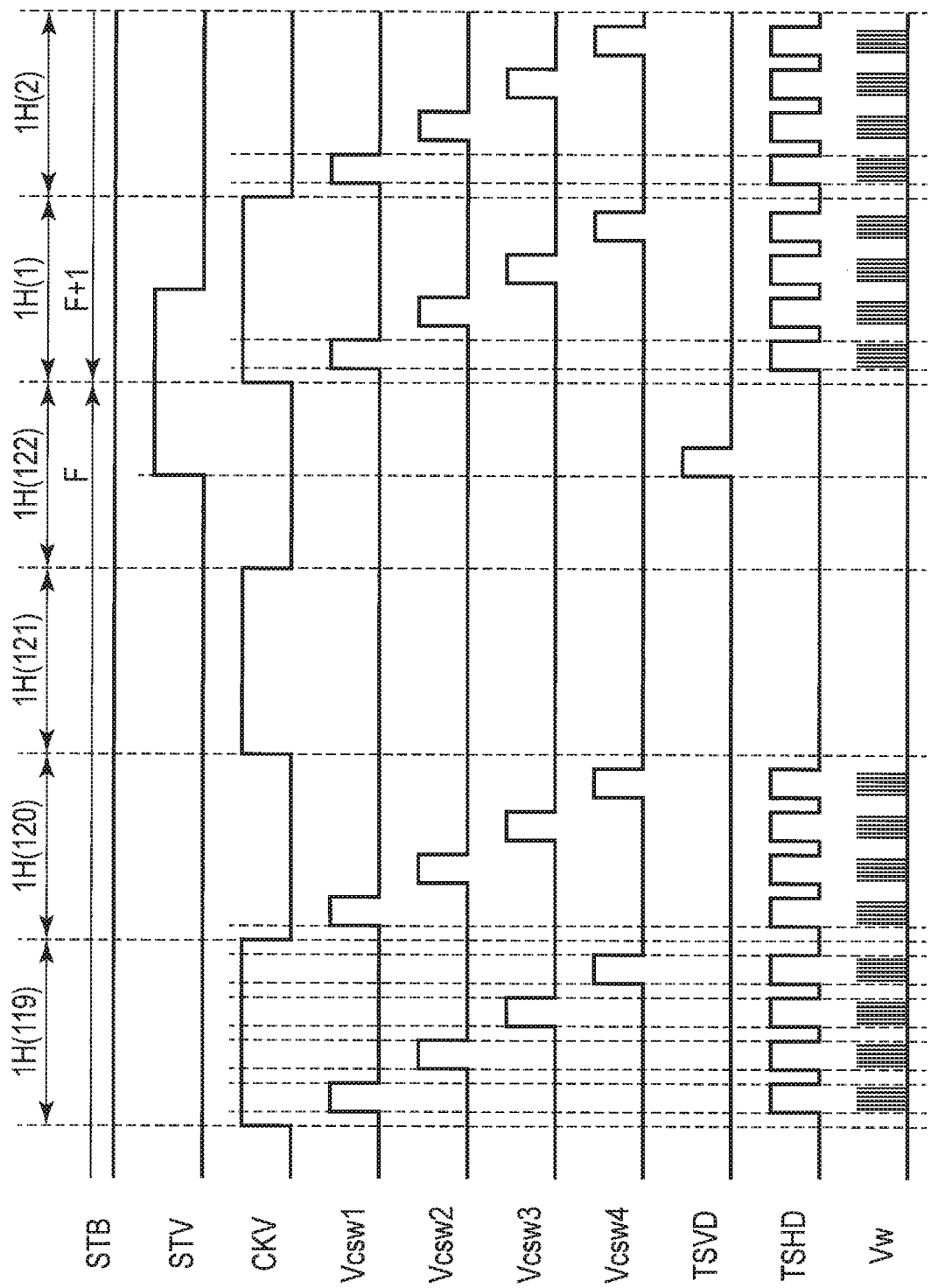
FIG. 8 is a timing chart for explanation of the method of driving the sensor, illustrating a reset signal, a start pulse signal, a clock signal, a control signal, a vertical synchronization signal, a horizontal synchronization signal, and a write signal in a period of part of an F frame period and a period of part of an F+1 frame period.

Next, an example of a method of driving the sensor SE will be explained. FIG. 8 is a timing chart for explanation of the method of driving the sensor SE of the present embodiment, illustrating a reset signal STB, a start pulse signal STV, a clock signal CKV, control signals Vcsw1, Vcsw2, Vcsw3 and Vcsw4, a vertical synchronization signal TSVD, a horizontal synchronization signal TSHD, and a write signal Vw, in a partial period of an F frame period and in a partial period of an F+1 frame period.

As shown in FIG. 8, a frame period (1F) is a vertical scanning period and corresponds to sequential 122 horizontal scanning periods. Each of the horizontal scanning periods (1H) is defined based on the clock signal CKV. Each of the frame periods is defined based on the vertical synchronization signal TSVD.

In a $119^{th}$ horizontal scanning period of the F frame period which is an F-th frame period, the control signals Vcsw1, Vcsw2, Vcsw3 and Vcsw4 based on the horizontal synchronization signal TSHD are supplied from the first detection unit DU1 to the multiplexer MU. The first control switch CSW1, the second control switch CSW2, the third control switch CSW3 and the fourth control switch CSW4 are thereby changed in time division from the second change state to the first change state (i.e., a state of making electrical connection between the connection line W1 and the signal line S).

In this horizontal scanning period, an on-level drive signal CS (power source voltage Vdd) is supplied to a $119^{th}$ control line C119, and an off-level drive signal CS (power source voltage Vss) is supplied to the control lines C other than the $119^{th}$ control line C119, from the control line drive circuit CD. Writing of the write signal Vw to the detection electrodes DE of pixels in the $119^{th}$ row and reading of the read signal Vr from the detection electrodes DE can be performed in time division.

In the $120^{th}$ horizontal scanning period of the F frame period, too, the control signals Vcsw1, Vcsw2, Vcsw3 and Vcsw4 are supplied from the first detection unit DU1 to the multiplexer MU, and the first control switch CSW1, the second control switch CSW2, the third control switch CSW3, and the fourth control switch CSW4 are changed in time division from the second change state to the first change state.

In addition, in this horizontal scanning period, an on-level drive signal CS (power source voltage Vdd) is supplied to a $120^{th}$ control line C120, and an off-level drive signal CS (power source voltage Vss) is supplied to the control lines C other than the $120^{th}$ control line C120, from the control line drive circuit CD. Writing of the write signal Vw to the detection electrodes DE of pixels in the $120^{th}$ row (i.e., the last row) and reading of the read signal Vr from the detection electrodes DE can be thereby performed in time division.

Sensing for one frame can be performed in the F frame.

Next, generation of a start pulse signal STV based on a vertical synchronization signal TSVD, and the like, are performed in a $122^{nd}$ horizontal scanning period after a $121^{st}$ horizontal scanning period of the F frame period has elapsed, and the F frame period shifts to F+1 frame period after the $122^{nd}$ horizontal scanning period has elapsed.

In the first horizontal scanning period of the F+1 frame period, which is one of the frame periods of the $F+1^{st}$ frame period, the first control switch CSW1, the second control switch CSW2, the third control switch CSW3, and the fourth control switch CSW4 are changed in time division from the second change state to the first change state, based on the control signals Vcsw1, Vcsw2, Vcsw3 and Vcsw4. In addition, in this horizontal scanning period, an on-level drive signal CS (power source voltage Vdd) is supplied to the first control line C1, and an off-level drive signal CS (power source voltage Vss) is supplied to the control lines C other than the first control line C1, from the control line drive circuit CD. Writing of the write signal Vw to the detection electrodes DE of pixels in the first row and reading of the read signal Vr from the detection electrodes DE can be performed in time division.

After this, writing of the write signal Vw to the detection electrodes DE of pixels in one row and reading of the read signal Vr from the detection electrodes DE are performed in each horizontal scanning period (1H). Thus, for example, when a finger contacts or approaches the input surface IS, the first detection unit DU1 (control module CM) can detect information of a fingerprint of the finger.

Figure 9:
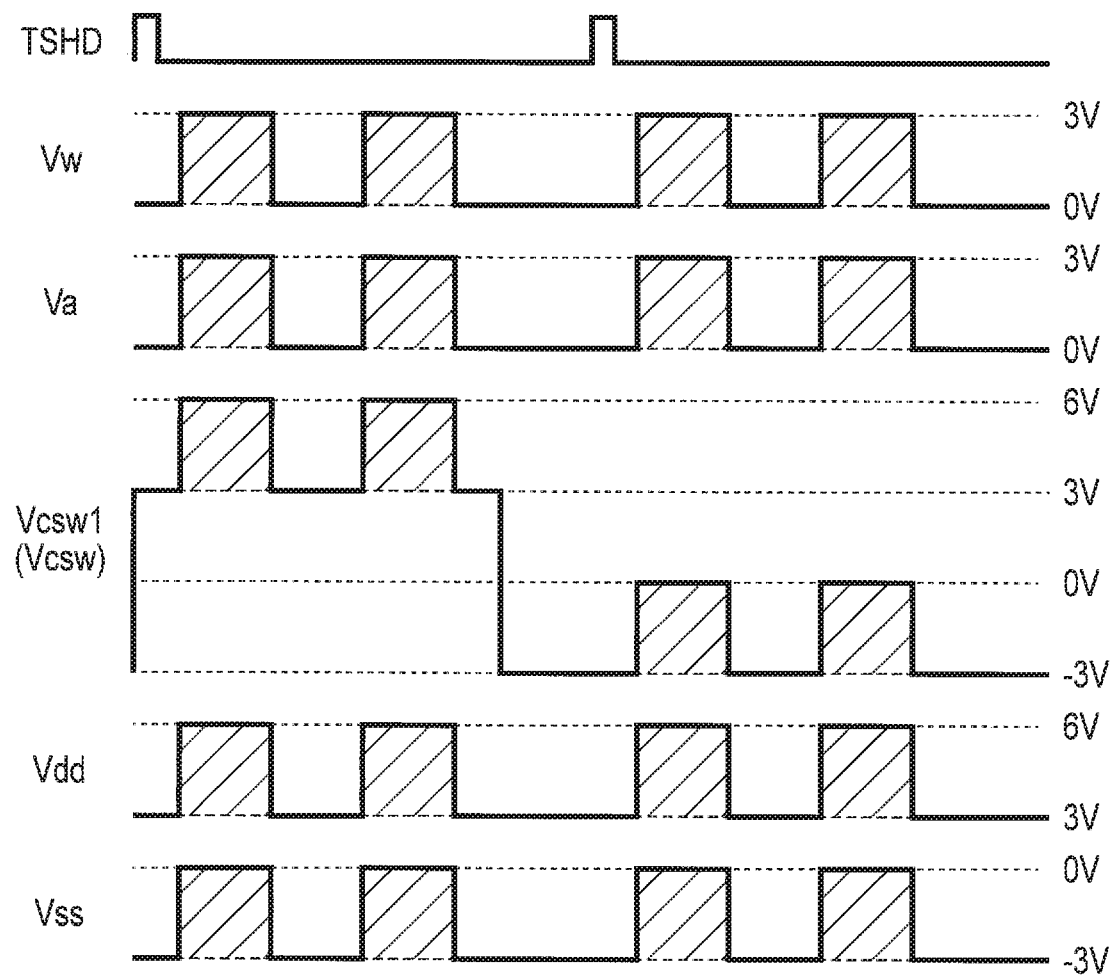
FIG. 9 is a timing chart for explanation of various signals and voltages used to drive the sensor, illustrating a horizontal synchronization signal, a write signal, a potential adjustment signal, a control signal, and power source voltages.

Next, various signals supplied from the first detection unit DU1 to the first substrate SUB1 will be explained. As explained above, various signals are characteristic in the present embodiment. FIG. 9 is a timing chart for explanation of various signals and voltages used to drive the sensor SE, illustrating the horizontal synchronization signal TSHD, the write signal Vw, the potential adjustment signal Va, the control signal Vcsw1 (Vcsw), the power source voltage Vdd and the power source voltage Vss. Examples of the signals and voltages are illustrated in FIG. 9.

As shown in FIG. 9, the write signal Vw is a pulse signal having a high-level potential of 3 V, a low-level potential of 0V and an amplitude of 3 V.

The potential adjustment signal Va is desirably a signal which is synchronized with the write signal Vw and which is equivalent in phase and amplitude to the write signal Vw, with reference to the constant voltage fixed to 0 V or the like. An amplitude of the potential adjustment signal Va may be 3 V. In this example, the potential adjustment signal Va is a signal which has a high-level potential of 3 V and a low-level potential of 0 V and which is equivalent to the write signal Vw, but is not limited to this and can be variously set. As another example, the potential adjustment signal Va may have a high-level potential of 6 V and a low-level potential of 3 V.

The write signal Vw and the potential adjustment signal Va are equivalent in the timing of changing to the high-level potential and the timing of changing to the low-level potential. In the same time period, shaded area of the write signal Vw is equal to shaded area of the potential adjustment signal Va. Even if the time has elapsed, the difference between the potential of the write signal Vw and the potential of the potential adjustment signal Va is constant and, in the present embodiment, 0 V.

The variation in the potential difference between the common electrode CE and the signal lines S to which the write signal Vw or the potential adjustment signal Va is supplied, and the variation in the potential difference between the common electrode CE and the detection electrodes DE to which the write signal Vw or the potential adjustment signal Va is supplied, can be therefore suppressed.

The control signal Vcsw has a high-level potential to change the detection switch DS to the first change state (i.e., the state in which the connection line W1 is electrically connected to the signal line S), and a low-level potential to change the detection switch DS to the second change state (i.e., the state in which the connection line W2 is electrically connected to the signal line S). In the present embodiment, the control signal Vcsw has a high-level potential of +3 V and a low-level potential of −3 V.

For the control signal Vcsw, however, a signal obtained by superposing the superposition signal on the pulse signal is more desirable than the pulse signal. The superposition signal is synchronized with the write signal Vw and is equivalent in phase and amplitude to the write signal Vw. The shaded area of the control signal Vcsw is superposed on the control signal Vcsw. For this reason, the potential of the control signal Vcsw becomes a maximum of 6 V if the superposition signal is superposed on the high-level potential of the control signal Vcsw, and the potential of the control signal Vcsw becomes a maximum of 0 V if the superposition signal is superposed on the low-level potential of the control signal Vcsw.

The variation in the potential difference between the common electrode CE and the control lines C to which the control signals Vcsw are supplied can be thereby suppressed.

The power source voltage Vdd is supplied to the control line drive circuit CD, and has a potential to change the detection switch DS to the first connection state, i.e., a state in which the signal lines S and the detection electrodes DE are electrically connected to each other. In the present embodiment, the potential of the power source voltage Vdd to change the detection switch DS to the first connection state is 3 V.

For the power source voltage Vdd, however, the voltage obtained by superposing the superposition signal on the constant voltage is more desirable than the high-potential constant voltage. The shaded area of the power source voltage Vdd is superposed on the power source voltage Vdd. For this reason, if the superposition signal is superposed on the constant voltage of the power source voltage Vdd, the potential of the power source voltage Vdd becomes a maximum of 6 V.

The variation in the potential difference between the common electrode CE and the lines such as the high-potential power source line Wd to which the power source voltage Vdd is supplied can be thereby suppressed.

The power source voltage Vss is supplied to the control line drive circuit CD, and has a potential to change the detection electrodes DE to the second connection state, i.e., a state in which the signal line S and the detection electrode DE are electrically disconnected while the auxiliary line A and the detection electrode DE are electrically connected. In the present embodiment, the potential of the power source voltage Vss to change the detection switch DS to the second connection state is −3 V.

For the power source voltage Vss, however, the voltage obtained by superposing the superposition signal on the constant voltage is more desirable than the low-potential constant voltage. The shaded area of the power source voltage Vss is superposed on the power source voltage Vss. For this reason, if the superposition signal is superposed on the constant voltage of the power source voltage Vss, the potential of the power source voltage Vdd becomes a maximum of 0 V.

The variation in the potential difference between the common electrode CE and the lines such as the low-potential power source line Ws to which the power source voltage Vss is supplied can be thereby suppressed.

According to the sensor SE and the method of driving the sensor SE, of the first embodiment configured as described above, the sensor SE comprises the control lines C, the signal lines S, the detection switches DS, the common electrode CE, the detection electrodes DE, a control line drive circuit CD serving as the first circuit, and the multiplexer MU serving as the second circuit. The common electrode CE is located above the control lines C, the signal lines S, the detection switches DS, the control line drive circuit CD, and the multiplexer MU and is opposed to them. The common electrode CE is not only formed on the active area AA, but also extends to the outside of the active area AA. The detection electrodes DE are located above the common electrode CE and opposed to the common electrode CE.

The detection electrodes DE can be electrically shielded by the common electrode CE, not only inside the active area AA, but also outside the active area AA. In other words, degradation in sensor sensitivity can be suppressed since parasitic capacitance can hardly be generated at the detection electrodes DE.

The first detection unit DU1 (control module CM) can adjust a signal and a voltage which are supplied to the first substrate SUB1. The parasitic capacitance can hardly be generated at the common electrode CE and the potential variation of the common electrode CE can be suppressed by controlling the potential of the conductive members such as the lines located under the common electrode CE. The degradation in sensor sensitivity can be further suppressed.

Thus, the sensor SE having excellent detection accuracy, and a method of driving the sensor SE can be obtained.

Second Embodiment

Next, a sensor SE and a method of driving the sensor SE, of a second embodiment, will be described. FIG. 10 is an equivalent circuit diagram showing an electrical connection between four pixels and various lines in the sensor SE of the second embodiment.

As shown in FIG. 10, the sensor SE of the second embodiment is different from the sensor SE of the first embodiment with respect to features that the sensor SE is formed without an auxiliary line A and that a detection switch DS is formed without second switching elements (DS1b, DS2b, DS3b and DS4b). In the present embodiment, a shielding electrode SH may be disposed in an electrically floating state or the sensor SE may be formed without the shielding electrode SH. Signal lines S and detection electrodes DE can be disconnected while the detection electrodes DE can be changed to an electrically floating state, by changing the state of the detection switches DS to the second connection state.

In the present embodiment, too, the potential adjustment signal Va can be supplied to the common electrode CE. For example, a potential adjustment signal Va can be supplied to the common electrodes CE via lines disposed outside an active area AA.

A method of driving the sensor SE is different from the method of driving the sensor SE of the first embodiment with respect to a feature that the potential adjustment signal Va is not supplied from the first detection unit DU1 to the signal lines S. However, the method of driving the sensor SE of the first embodiment can be broadly applied as the method of driving the sensor SE of the present embodiment.

According to the sensor SE and the method of driving the sensor SE, of the second embodiment, the sensor SE comprises control lines C, signal lines S, the detection switch DS, the common electrode CE, detection electrodes DE, a control line drive circuit CD, and a multiplexer MU. For this reason, the same advantages as those of the first embodiment can also be obtained in the second embodiment.

In the sensing drive, a detection electrode DE to which the write signal Vw is not to be written can be changed to the electrically floating state. In this case, too, the parasitic capacitance can hardly be generated at the common electrode CE and the potential variation of the common electrode CE can be suppressed. The degradation in sensor sensitivity can be thereby suppressed.

Thus, the sensor SE having excellent detection accuracy, and a method of driving the sensor SE can be obtained.

Third Embodiment

Figure 11:
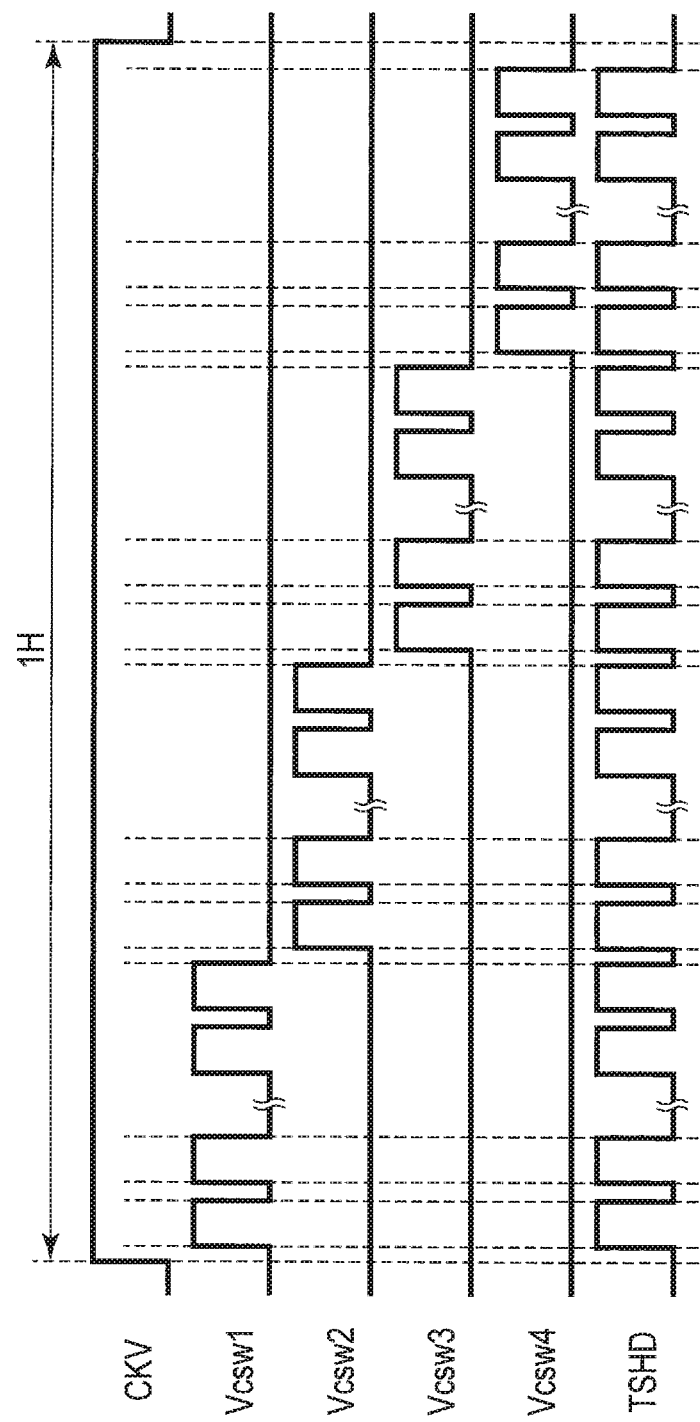
FIG. 11 is a timing chart for explanation of a method of driving a sensor of a third embodiment, illustrating a clock signal, control signals, and a horizontal synchronization signal in a horizontal scanning period.

Next, a sensor SE and a method of driving the sensor SE, of a third embodiment, will be described. FIG. 11 is a timing chart for explanation of the method of driving the sensor SE of the third embodiment, illustrating a clock signal CKV, control signals Vcsw1, Vcsw2, Vcsw3, and Vcsw4, and a horizontal synchronization signal TSHD in a horizontal scanning period (1H). The sensor SE of the present embodiment is configured similarly to the sensor SE of the first embodiment.

As shown in FIG. 11, the present embodiment is different from the first embodiment with respect to a feature that each of control switches CSW of the multiplexer MU is changed to a first change state and a second change state, alternately, at plural times, by the control signals Vcsw1, Vcsw2, Vcsw3, and Vcsw4, in a particular horizontal scanning period (1H). The frequency of a pulse of the horizontal synchronization signal TSHD can be made equivalent to that of the first embodiment. In this case, the time period of the horizontal scanning period (1H) is longer than that of the first embodiment.

The same detection electrode DE is handled as a target of sensing, and a set of writing of a write signal Vw to the same detection electrode DE and reading of a read signal Vr from the detection electrode DE can be repeated at plural times, in the horizontal scanning period (1H). The read signals Vr read from the same detection electrode DE can be accumulated in a detector DT and output as an output signal Vout.

According to the sensor SE and the method of driving the sensor SE, of the third embodiment, the sensor SE comprises control lines C, signal lines S, detection switches DS, a common electrode CE, detection electrodes DE, a control line drive circuit CD, and a multiplexer MU. For this reason, the same advantages as those of the first embodiment can also be obtained in the third embodiment.

In the sensing drive, the read signals Vr read from the same detection electrode DE at plural times can be accumulated. The level of the output signal Vout can be raised by accumulating the read signals Vr as compared with a case of reading a read signal Vr. For example, a difference between the value of the output signal Vout in a case where a protruding portion of the fingerprint is opposed to the detection electrode DE and the value of the output signal Vout in a case where a recess portion of the fingerprint is opposed to the first detection electrode DE can be increased. A detected object such as a fingerprint can be thereby sensed in more detail.

Thus, the sensor SE having excellent detection accuracy, and a method of driving the sensor SE can be obtained.

Fourth Embodiment

Figure 12:
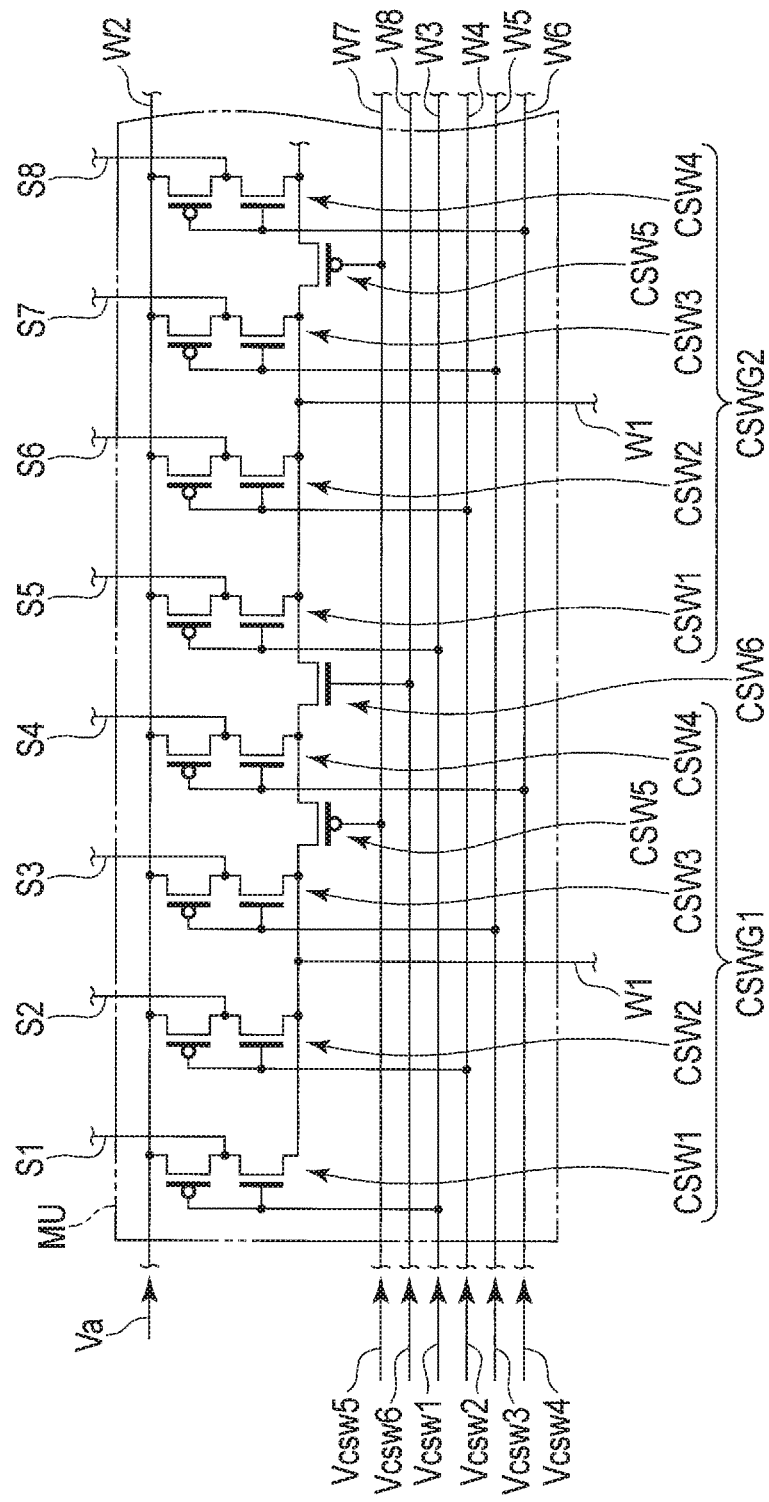
FIG. 12 is an enlarged plan view showing in part an outside of an active area of a first substrate in a sensor of a fourth embodiment, illustrating a circuit diagram of a multiplexer.

Next, a sensor SE and a method of driving the sensor SE, of a fourth embodiment, will be described. FIG. 12 is an enlarged plan view showing in part an outside of an active area AA of a first substrate SUB1 in a sensor SE of the fourth embodiment, illustrating a multiplexer MU.

As shown in FIG. 12, the sensor SE of the fourth embodiment is different from the sensor SE of the first embodiment with respect to a feature that a multiplexer MU further comprises fifth control switches CSW5, sixth control switches CSW6, and two control lines W7 and W8.

Each of the control switch groups CSWG further includes a fifth control switch CSW5. A second electrode of the third control switch CSW3 is connected to a second electrode of the fourth control switch CSW4 via the fifth control switch CSW5. A gate electrode (first electrode) of the fifth control switch CSW5 is connected to the control line W7. The conduction type of the thin-film transistor composing the fifth control switch CSW5 is not particularly limited and, in the present embodiment, the fifth control switch CSW5 is composed of a P-channel thin-film transistor. A control signal Vcsw5 is supplied from the first detection unit DU1 to a control line W7. The fifth control switch CSW5 is changed to either of the conductive state and the nonconductive state by the control signal Vcsw5.

Adjacent control switch groups CSWG are connected to each other via a sixth control switch CSW6. For example, a second electrode of a fourth control switch CSW4 of a first control switch group CSWG1 is connected to a second electrode of a first control switch CSW1 of a second control switch group CSWG2 via the sixth control switch CSW6. A gate electrode (first electrode) of the sixth control switch CSW6 is connected to the control line W8. The conduction type of the thin-film transistor composing the sixth control switch CSW6 is not particularly limited and, in the present embodiment, the sixth control switch CSW6 is composed of an N-channel thin-film transistor. A control signal Vcsw6 is supplied from the first detection unit DU1 to a control line W8. The sixth control switch CSW6 is changed to either of the conductive state and the nonconductive state by a control signal Vcsw6.

Next, a method of driving the sensor SE will be explained.

In relation to the method of driving the sensor SE of the first embodiment, performing the sensing by independently writing the write signal Vw to a detection electrode DE via a connection line W1 and independently reading the read signal Vr from the detection electrode DE via the connection line W1, in a sensing period of the sensing drive, has been explained. In the fourth embodiment, too, the sensing can be performed similarly to the first embodiment. In the fourth embodiment, however, the sensing can also be performed in a manner different from the first embodiment, by adding the fifth control switches CSW5 and the sixth control switches CSW6 to the multiplexer MU.

Next, a method of driving the sensor SE peculiar to the fourth embodiment will be broadly explained. In the fourth embodiment, the write signals Vw are simultaneously written to four detection electrodes DE located in the n-th row and the n+1-th row, of the m-th column and the m+1-th column, via the multiplexer MU, two corresponding signal line S and four corresponding detection switches DS, read signals Vr indicating the variation of the write signals Vw are read from four detection electrodes DE, respectively, and the read signals Vr are bundled to one signal, in the first sensing period of the sensing drive of performing the sensing. The sensing can be performed while increasing the electrode area and raising the electrode intensity, by using four detection electrodes DE.

Next, in a second sensing period following the first period, the write signals Vw are simultaneously written to four detection electrodes DE located in the n-th row and the n+1-th row, of the m+1-th column and the m+2-th column, via the multiplexer MU, two corresponding signal line S and four corresponding detection switches DS, read signals Vr indicating the variation of the write signals Vw are read from four detection electrodes DE, respectively, and the read signals Vr are bundled to one signal. In other words, the sensing can be performed while displacing the range by one column, in the first direction X.

The first detection unit DU1 ends the sensing of the detection electrodes DE located in the n-th row and the n+1-th row and then shifts to the sensing of the detection electrodes DE located in the n+1-th row and the n+2-th row, in the sensing drive. Since the sensing can be performed while displacing the range by one row, in the second direction Y, too, the resolution level of the first embodiment can be kept.

Next, a method of driving the sensor SE of the fourth embodiment will be explained with reference to FIG. 13 to FIG. 17. FIG. 13 to FIG. 17 are circuit diagrams for explanation of an example of the method of driving the sensor SE of the fourth embodiment. Main portions alone necessary for explanations, of the first substrate SUB1, are illustrated in FIG. 13 to FIG. 17. The detection switches DS will be explained as switches for changing the state of connection between the signal line S and the detection electrode DE. The control switches CSW will be explained as switches for changing the state of connection between the signal line S and the connection line W1.

Figure 13:
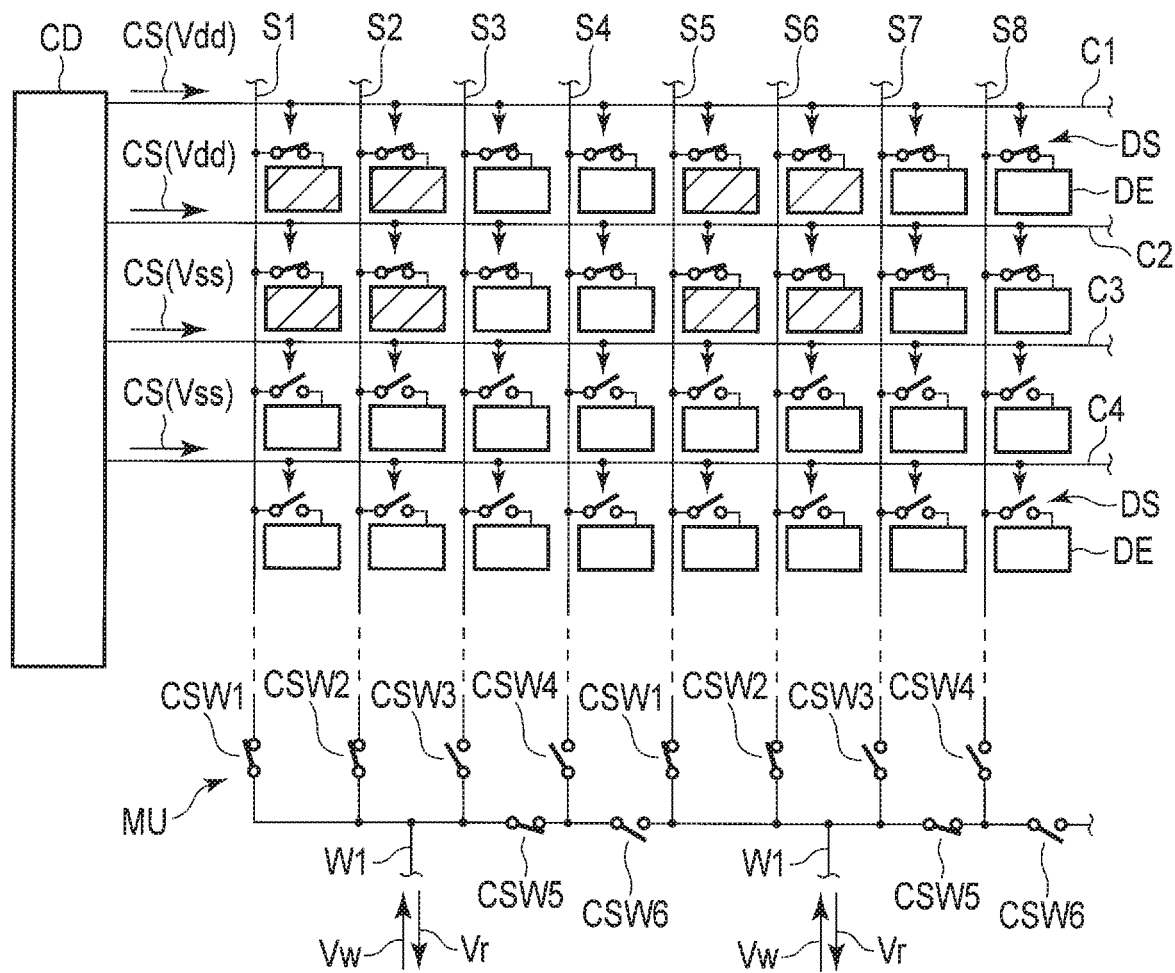
FIG. 13 is a circuit diagram for explanation of an example of a method of driving the sensor of the fourth embodiment.

As shown in FIG. 13, the control line drive circuit CD supplies an on-level drive signal CS (power source voltage Vdd) to the first control line C1 and the second control line C2, simultaneously, and supplies an off-level drive signal CS (power source voltage Vss) to the control lines C other than the first control line C1 and the second control line C2, under control of the control module CM. The detection switches DS in the first and second rows thereby become conductive. In the multiplexer MU, the first control switch CSW1 and the second control switch CSW2 become conductive, and the third control switch CSW3 and the fourth control switch CSW4 become nonconductive. The sixth control switch CSW6 is also allowed to become nonconductive.

Four shaded adjacent detection electrodes DE, of the detection electrodes DE in the first and second rows, become in an electrically bundled state. The write signal Vw is supplied to a first signal line S1, a second signal line S2, a fifth signal line S5 and a sixth signal line S6, of the first to eighth signal lines S1 to S8. Thus, the writing of the write signal Vw and the reading of the read signal Vr can be performed together for four bundled detection electrodes DE via one connection line W1.

Figure 14:
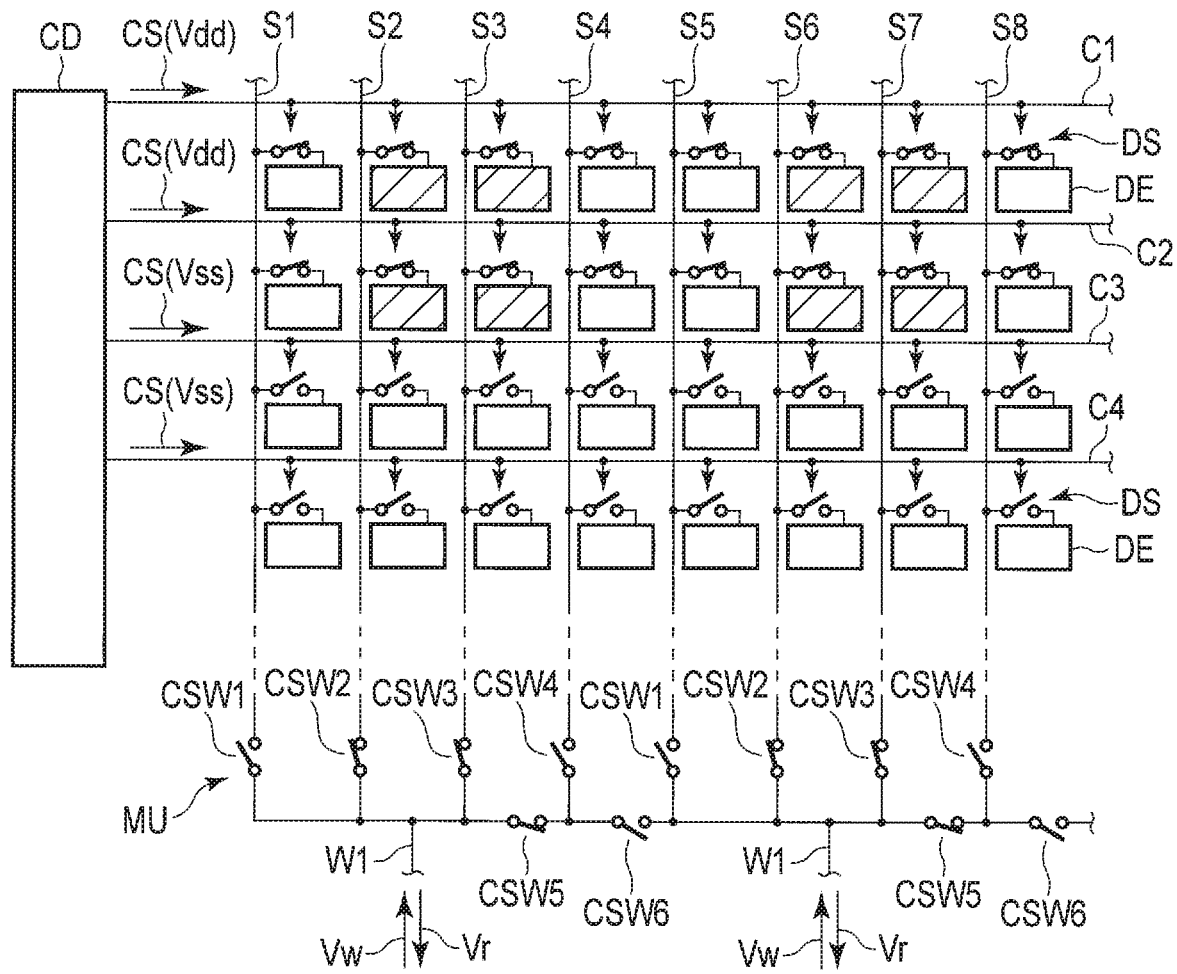
FIG. 14 is a circuit diagram for explanation of the example of the method of driving the sensor of the fourth embodiment, subsequent with FIG. 13.

As shown in FIG. 14, the detection switches DS in the first and second rows become conductive, in a next sensing period. In the multiplexer MU, the second control switch CSW2 and the third control switch CSW3 becomes conductive, and the first control switch CSW1 and the fourth control switch CSW4 becomes nonconductive. The sixth control switch CSW6 is also allowed to become nonconductive.

Four shaded adjacent detection electrodes DE, of the detection electrodes DE in the first and second rows, become in an electrically bundled state. It can be understood that four bundled detection electrodes DE are displaced by one column as compared with FIG. 13. The write signal Vw is supplied to the second signal line S2, the third signal line S3, the sixth signal line S6 and the seventh signal line S7, of the first to eighth signal lines S1 to S8. Thus, the writing of the write signal Vw and the reading of the read signal Vr can be performed together for four bundled detection electrodes DE via one connection line W1.

Figure 15:
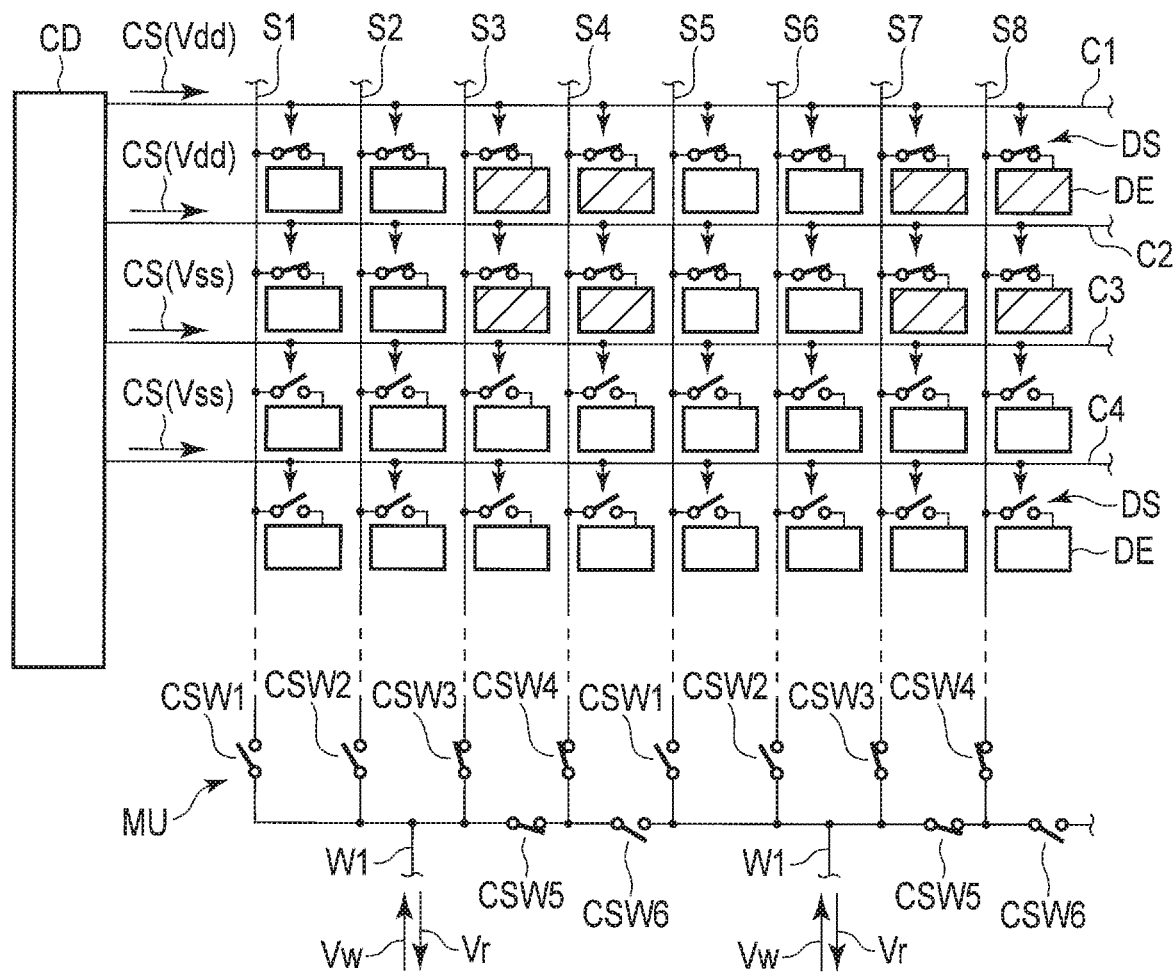
FIG. 15 is a circuit diagram for explanation of the example of the method of driving the sensor of the fourth embodiment, subsequent with FIG. 14.

As shown in FIG. 15, the detection switches DS in the first and second rows become conductive, in a next sensing period. In the multiplexer MU, the third control switch CSW3 and the fourth control switch CSW4 becomes conductive, and the first control switch CSW1 and the second control switch CSW2 becomes nonconductive. The fifth control switch CSW5 becomes conductive, and the sixth control switch CSW6 becomes nonconductive.

Four shaded adjacent detection electrodes DE, of the detection electrodes DE in the first and second rows, become in an electrically bundled state. It can be understood that four bundled detection electrodes DE are further displaced by one column as compared with FIG. 14. The write signal Vw is supplied to the third signal line S3, the fourth signal line S4, the seventh signal line S7 and the eighth signal line S8, of the first to eighth signal lines S1 to S8. Thus, the writing of the write signal Vw and the reading of the read signal Vr can be performed together for four bundled detection electrodes DE via one connection line W1.

Figure 16:
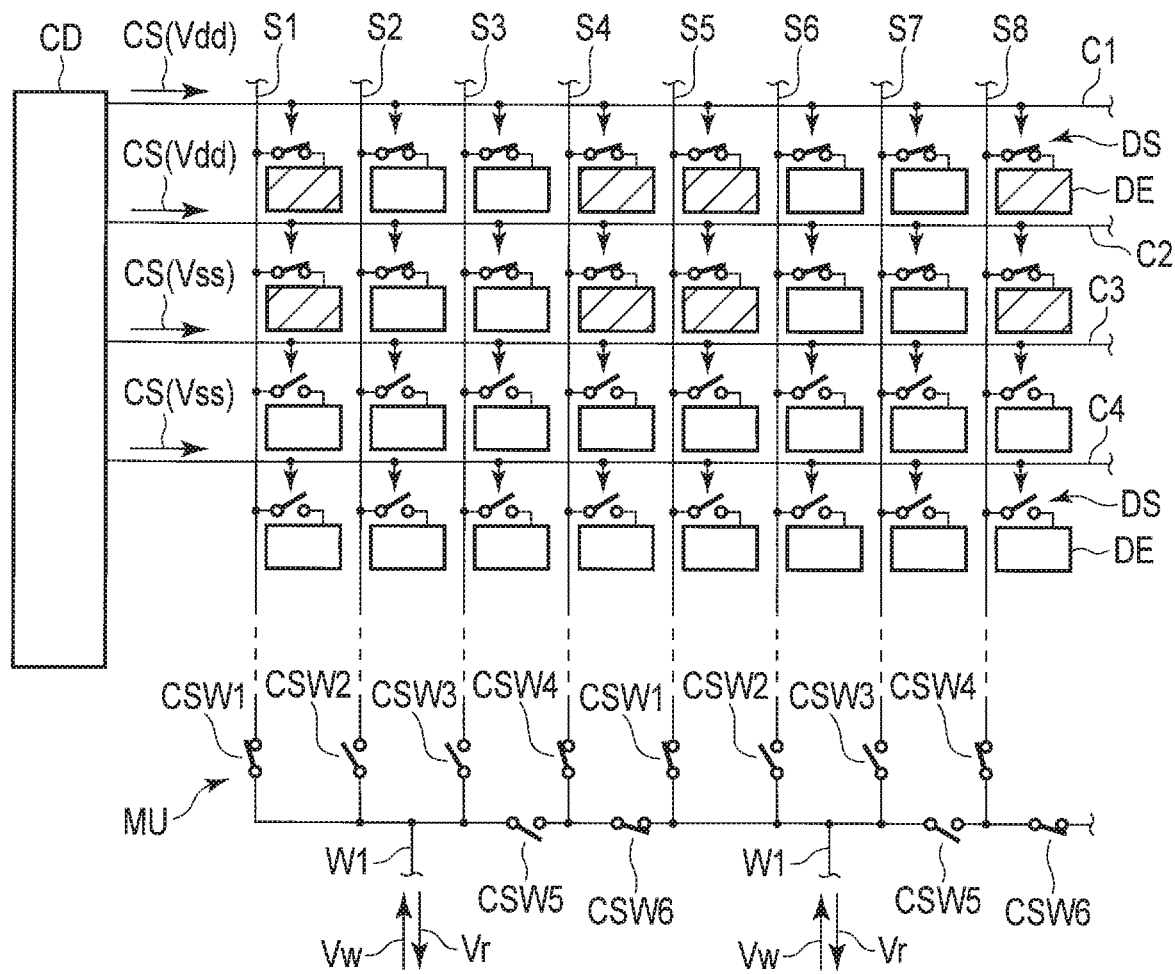
FIG. 16 is a circuit diagram for explanation of the example of the method of driving the sensor of the fourth embodiment, subsequent with FIG. 15.

As shown in FIG. 16, the detection switches DS in the first and second rows become in conductive, in a next sensing period. In the multiplexer MU, the fourth control switch CSW4 and the first control switch CSW1 becomes conductive, and the second control switch CSW2 and the third control switch CSW3 becomes nonconductive. The fifth control switch CSW5 becomes nonconductive, and the sixth control switch CSW6 becomes conductive.

Two or four shaded adjacent detection electrodes DE, of the detection electrodes DE in the first and second rows, thereby become in an electrically bundled state. It can be understood that four bundled detection electrodes DE are further displaced by one column as compared with FIG. 15. The write signal Vw is supplied to the first signal line S1, the fourth signal line S4, the fifth signal line S5 and the eighth signal line S8, of the first to eighth signal lines S1 to S8. Thus, the writing of the write signal Vw and the reading of the read signal Vr can be performed together for two or four bundled detection electrodes DE via one connection line W1.

The first detection unit DU1 ends the sensing for the detection electrodes DE located in the first and second rows. After that, the first detection unit DU1 shifts to the sensing for the detection electrodes DE located in the second and third rows.

As shown in FIG. 17, the control line drive circuit CD supplies an on-level drive signal CS (power source voltage Vdd) to the second control line C2 and the third control line C3, simultaneously, and supplies an off-level drive signal CS (power source voltage Vss) to the control lines C other than the second control line C2 and the third control line C3, under control of the control module CM. The detection switches DS in the second and third rows thereby become conductive. In the multiplexer MU, the first control switch CSW1 and the second control switch CSW2 becomes conductive, and the third control switch CSW3 and the fourth control switch CSW4 becomes nonconductive. The sixth control switch CSW6 is also allowed to become nonconductive.

Four shaded adjacent detection electrodes DE, of the detection electrodes DE in the second and third rows, become in an electrically bundled state. The write signal Vw is supplied to a first signal line S1, a second signal line S2, a fifth signal line S5 and a sixth signal line S6, of the first to eighth signal lines S1 to S8. Thus, the writing of the write signal Vw and the reading of the read signal Vr can be performed together for four bundled detection electrodes DE via one connection line W1.

The sensing in the second and third rows can also be performed by bundling the detection electrodes DE while displacing the range by one column. In the second direction Y, too, the sensing can be performed while displacing the range by one row.

According to the sensor SE and the method of driving the sensor SE, of the fourth embodiment, the sensor SE comprises a control line C, a signal line S, a detection switch DS, a common electrode CE, a detection electrode DE, a control line drive circuit CD, and a multiplexer MU. For this reason, the same advantages as those of the first embodiment can also be obtained in the fourth embodiment.

In the sensing drive, the writing of the write signal Vw and the reading of the read signal Vr can be performed together for four (or two) bundled detection electrodes DE by the first detection unit DU1. For this reason, the sensing can be performed by increasing the electrode area and raising the electrode intensity.

At this time, the sensing can be performed while displacing the range by one column in the first direction X, and the sensing can also be performed while displacing the range by one row in the second direction Y. For this reason, the degradation in sensing resolution can be suppressed or prevented.

Furthermore, in the fourth embodiment, too, the first detection unit DU1 may adjust the driving of the first substrate SUB1 and accumulate the read signals Vr. A detected object such as a fingerprint can be thereby sensed in more detail.

When the detection electrodes DE are bundled or displaced, a total of nine detection electrodes DE in three adjacent rows and three adjacent columns may be bundled and then displaced in each column or each row. Alternatively, a total of sixteen detection electrodes DE in four adjacent rows and four adjacent columns may be bundled and then displaced in each column or each row.

Thus, the sensor SE having excellent detection accuracy, and a method of driving the sensor SE can be obtained.

Fifth Embodiment

Next, a liquid crystal display device of a fifth embodiment will be described. In the present embodiment, the liquid crystal display device is a sensor-equipped liquid crystal display device. FIG. 18 is a perspective view showing a configuration of a liquid crystal display device of a fifth embodiment.

As shown in FIG. 18, the liquid crystal display device DSP comprises an active-matrix liquid crystal display panel PNL, a driving IC IC1 which drives the liquid crystal display panel PNL, a backlight unit BL which illuminates the liquid crystal display panel PNL, a control module CM, flexible printed circuits FPC1, FPC3, and the like.

The liquid crystal display panel PNL includes a plate-like first substrate SUB1, a plate-like second substrate SUB2 disposed to be opposed to the first substrate SUB1, and a liquid crystal layer held between the first substrate SUB1 and the second substrate SUB2. In the present embodiment, the first substrate SUB1 can be restated as an array substrate, and the second substrate SUB2 can be restated as a counter-substrate.

The first substrate SUB1 of the above-described embodiments can be applied as the first substrate SUB1 of the present embodiment. In the present embodiment, however, the first substrate SUB1 can be modified as needed since the first substrate SUB1 is applied to the liquid crystal display panel PNL. For example, an alignment film may be disposed on the surface of the first substrate SUB1 which is in contact with the liquid crystal layer. Besides, the functions of the members composing the first substrate SUB1 may be different from those of the above-described embodiments. For example, the detection electrodes DE of the above-explained members also functions as pixel electrodes, and the detection switches DS also function as pixel switches. Signal lines S further have a function of transmitting image signals (for example, video signals) to the detection electrodes DE via the detection switches DS.

In the present specification, the detection electrodes DE are often called pixel electrodes (PE), the detection switches DS are often called pixel switches (PSW), the control lines C are often called scanning lines (G), and a control line drive circuit CD is often called a scanning line drive circuit (GD).

The liquid crystal display panel PNL includes a display area DA on which an image is displayed. The display area DA corresponds to the active area AA of the above-described embodiments. The liquid crystal display panel PNL is a transmissive liquid crystal display panel having a transmissive display function of displaying an image by selectively transmitting backlight from the backlight unit BL. The liquid crystal display panel PNL may be a trans-reflective liquid crystal display panel having a reflective display function of displaying images by selectively reflecting external light, besides the transmissive display function.

Figure 19:
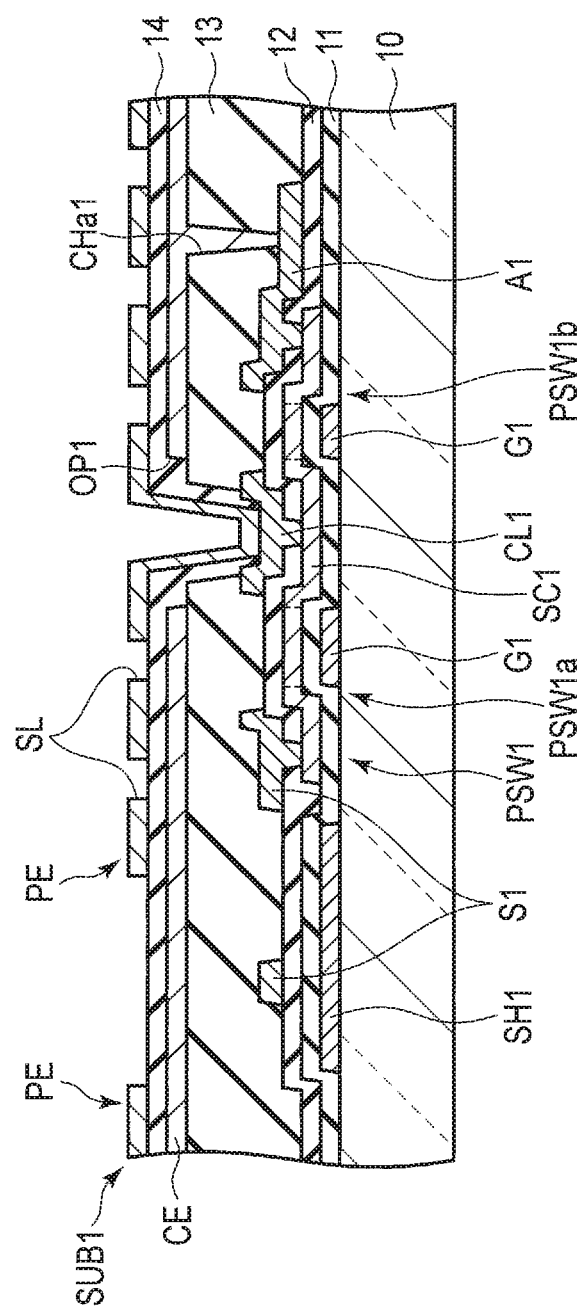
FIG. 19 is a cross-sectional view showing a first substrate in the liquid crystal display device of the fifth embodiment.

As shown in FIG. 19, the liquid crystal display panel PNL has a configuration corresponding to an in-plane switching (IPS) mode using a lateral electric field approximately parallel to a main surface of the substrate, in an FFS mode or the like. The main surface of the substrate is a surface parallel to an X-Y plane defined by the first direction X and the second direction Y. In the present embodiment, both the pixel electrodes PE and the common electrode CE are disposed on the first substrate SUB1. Since the lateral electric field is formed, each pixel electrode PE includes, for example, a slit SL at a position opposed to the common electrode CE. In the example illustrated, the pixel electrodes PE are connected to the first pixel switch PSW1 comprising a first switching element PSW1$a$ and a second switching element PSW1$b$.

For this reason, the liquid crystal display panel PNL can be formed by using the generally known TFT liquid crystal process as it is.

As shown in FIG. 18, the backlight unit BL is disposed on a back surface side of the first substrate SUB1. Various types of units are applicable as the backlight unit BL and a backlight unit using light-emitting diodes (LEDs) as a light source is also applicable, but descriptions on details of its structure are omitted. If the liquid crystal display panel PNL is a reflective liquid crystal display panel having the reflective display function alone, the backlight unit BL is not disposed.

The liquid crystal display device DSP may comprise the above-explained cover member CG. For example, a cover member CG can be disposed above an outer surface on a screen side of the liquid crystal display panel PNL on which images are displayed. The outer surface is opposite to a surface of the second substrate SUB2 which is opposed to the first substrate SUB1, and includes a display surface on which images are displayed.

The driving IC IC1 serving as a first driving module is mounted on the first substrate SUB1 of the liquid crystal display panel PNL. The driving IC IC1 is connected to the multiplexer MU and the scanning line drive circuit. The common electrode CE is not opposed to the driving IC IC1 but extended to the outside of the display area DA and opposed to the multiplexer MU and scanning line drive circuit. The flexible printed circuit FPC1 connects the liquid crystal display panel PNL with the control module CM. The control module CM supplies signals and voltages to the driving IC IC1. The flexible printed circuit FPC3 connects the backlight unit BL with the control module CM.

Next, a method of driving the liquid crystal display device DSP of the fifth embodiment will be explained.

In the fifth embodiment, the liquid crystal display device DSP can perform display driving of displaying images and sensing driving of performing the sensing.

In the display driving, the common electrode drive circuit can supply a common drive signal to the common electrode CE. The common electrode drive circuit can be formed at, for example, a driving IC IC1. The examples of the common drive signal (common voltage) includes a constant voltage such as 0 V. Alternately, the image signals can be supplied to the pixel electrodes by the driving IC IC1, the multiplexer MU, the scanning line drive circuit and the like.

In contrast, the sensing driving can set a sensing period in a blanking period during a display period for performing the display driving. Examples of the blanking period include a horizontal blanking period and a vertical blanking period. The first detection unit DU1 sets the pixel electrodes located in a part of the display area DA to be a target of sensing, in the sensing driving for performing the sensing. In the present embodiment, the first detection unit DU1 sets the pixel electrodes located in the sensing area SA of the display area DA to be a target of sensing. Thus, sensing needs only to be performed within a range of the sensing area SA, and does not need to be performed in the entire display area DA. For example, reduction of the time period for sensing can be attempted. In addition, the deterioration in display quality outside the sensing area SA can be suppressed.

The first detection unit DU1 writes a write signal Vw to each of the pixel electrodes located in the sensing area SA via the multiplexer MU, the corresponding signal line S and the corresponding pixel switch, and reads a read signal Vr indicating the variation of the write signal from each of the pixel electrodes. A detected object can be thereby sensed. Such sensing is preferable in a case of detecting a fingerprint or the like.

In the present embodiment, too, supplying the potential adjustment signal Va to the common electrode CE in the sensing period is desirable since degradation in sensor sensitivity can be suppressed.

Alternatively, the common electrode CE may not be formed as a single electrode, but composed of the electrodes spaced apart from each other in an electrical insulation distance, in the sensing area SA and the area other than the sensing area SA. Thus, the potential adjustment signal Va can be supplied to the electrode (common electrode CE) of the sensing area SA, and the common drive signal can be supplied to the electrode (common electrode CE) in the area other than the sensing area SA. The deterioration in display quality outside the sensing area SA can be thereby suppressed while suppressing the degradation in sensor sensitivity.

According to the sensor-equipped liquid crystal display device DSP and the method of driving the sensor-equipped liquid crystal display device DSP, of the fifth embodiment, the liquid crystal display device DSP comprises a scanning line, a signal line S, a pixel switch, a common electrode CE, a pixel electrode, a scanning line drive circuit, and a multiplexer MU, similarly to the sensor SE of the above-described embodiments. For this reason, the same advantages as those of the first embodiment can also be obtained in the fifth embodiment.

In addition, the lines, electrodes, switches, circuits and the like used to display images can also be used for the sensing. For this reason, addition of the members for sensing to the liquid crystal display device DSP can be suppressed.

In the fifth embodiment, too, sensing can be performed by changing the operation to either of the first mode (self-capacitive sensing mode) and the second mode (mutual-capacitive sensing mode).

Thus, the liquid crystal display device DSP equipped with the sensor having excellent detection accuracy, and a method of driving the sensor-equipped liquid crystal display device DSP can be obtained.

Sixth Embodiment

Next, a liquid crystal display device DSP of a sixth embodiment will be described. In the present embodiment, the liquid crystal display device is a sensor-equipped liquid crystal display device.

In the fifth embodiment, the display driving and the sensing driving are performed, and the area where the sensing is to be performed is specified in a part of the display area DA. In contrast, in the sixth embodiment, the display driving and the sensing driving are performed, and the position detection driving for specifying a position of a detected object is further is performed. Thus, a specific area can be sensed by the sensing driving after specifying the area where the detected object is located by the position detection driving. For example, the area where the detected object is located can be specified by the position detection driving, and the uneven pattern of the detected object can be detected by the sensing driving.

To specify the position of the detected object, a position detection sensor PSE located in the display area DA of the liquid crystal display panel PNL is used. The position detection sensor PSE is different from a sensor for detecting an uneven pattern on a detected object. A second detection unit DU2 is connected to the position detection sensor PSE. The second detection unit DU2 drives the position detection sensor PSE and detects position information of the detected object, in the position detection driving for detecting the position information of the detected object. The position detection sensor PSE is driven by the second detection unit DU2 different from the first detection unit DU1. The first detection unit DU1 sets the pixel electrodes of the area where the detected object is located to be a target of sensing, based on the position information, in the sensing driving for detecting the uneven pattern on the detected object.

An electrode of the position detection sensor PSE used to specify the position of the detected object can be selected from various electrodes in the liquid crystal display device DSP.

For example, the common electrode CE can be selected as the electrode of the position detection sensor PSE. In this case, the common electrode CE is formed by electrodes. For example, the electrodes are arrayed in a matrix. The second detection unit DU2 writes a first signal Wr to each of the electrodes, and reads a second signal Re indicating the variation of the first signal from each of the electrodes. As explained above, the position information of the detected object can be detected in the self-capacitive sensing mode.

Alternatively, position detection electrodes Rx added to the liquid crystal display device DSP can be selected as the electrode of the position detection sensor PSE. For example, the position detection electrodes Rx are arrayed in a matrix. The second detection unit DU2 writes a first signal Wr to each of the position detection electrodes Rx and reads a second signal Re indicating the variation of the first signal from each of the position detection electrodes Rx. As explained above, the position information of the detected object can be detected in the self-capacitive sensing mode.

Alternatively, a set of the common electrode CE and the position detection electrodes Rx added to the liquid crystal display device DSP can be selected as the electrodes of the position detection sensor PSE. For example, the position detection electrodes Rx and the electrodes of the common electrode CE are disposed to intersect each other. The second detection unit DU2 writes the first signal Wr to each of the common electrodes CE and reads the second signal Re from each of the position detection electrodes Rx. The position information of the detected object can be detected in the mutual-capacitive sensing mode as explained above.

In the following explanations, a combination of the common electrode CE and the position detection electrodes Rx is selected as the electrodes of the position detection sensor PSE, and the position information of the detected object is detected in the mutual-capacitive sensing mode, in the present embodiment.

First, a configuration of the liquid crystal display device of the sixth embodiment will be described. FIG. 20 is a perspective view showing the configuration of the sensor-equipped liquid crystal display device DSP of the sixth embodiment.

As shown in FIG. 20, the liquid crystal display device DSP comprises an active-matrix liquid crystal display panel PNL, a driving IC IC1 which drives the liquid crystal display panel PNL, a capacitive position detection sensor PSE, a driving IC IC2 which drives the position detection sensor PSE, a backlight unit BL, a control module CM, flexible printed circuits FPC1, FPC2, and FPC3, and the like. In the present embodiment, a second detection unit DU2 is composed of the driving IC IC1 and the driving IC IC2. The liquid crystal display panel PNL includes the first substrate SUB1, the second substrate SUB2 and the liquid crystal layer.

The driving IC IC1 serving as a first driving module is mounted on the first substrate SUB1 of the liquid crystal display panel PNL. The flexible printed circuit FPC1 connects the liquid crystal display panel PNL with the control module CM. The flexible printed circuit FPC2 connects position detection electrodes Rx of the position detection sensor PSE with the control module CM. The driving IC IC2 serving as a second driving module is mounted on the flexible printed circuit FPC2.

The driving IC IC1 and the driving IC IC2 are connected to each other via the flexible printed circuit FPC2 or the like. For example, if the flexible printed circuit FPC2 includes a branch portion FPCB connected onto the first substrate SUB1, the driving IC IC1 and the driving IC IC2 may be connected via the branch portion FPCB and a line on the first substrate SUB1. Alternatively, the driving IC IC1 and the driving IC IC2 may be connected to each other via the flexible printed circuits FPC1 and FPC2.

The driving IC IC2 can supply a timing signal to inform a driving period of the position detection sensor PSE to the driving IC IC1. The driving IC IC1 can supply a timing signal to inform a driving period of the common electrodes CE which will be explained later, to the driving IC IC2. Alternatively, the control module CM can supply timing signals to the driving IC IC1 and the driving IC IC2. Driving the driving IC IC1 can be synchronized with driving the driving IC IC2 by the timing signal.

Next, an operation in position detection driving of performing the position detection to detect contact or approach of the detected object executed at the sensing driving for sensing to detect contact or approach of a conductor to the input surface of the liquid crystal display device DSP will be explained. In other words, a position detection sensor drive signal is supplied from the common electrode drive circuit to the common electrode CE. The position detection is performed by allowing the position detection sensor PSE to receive a sensor signal from the common electrode CE, in this state.

A principle in an example of the position detection will be explained with reference to FIG. 21.

Figure 21:
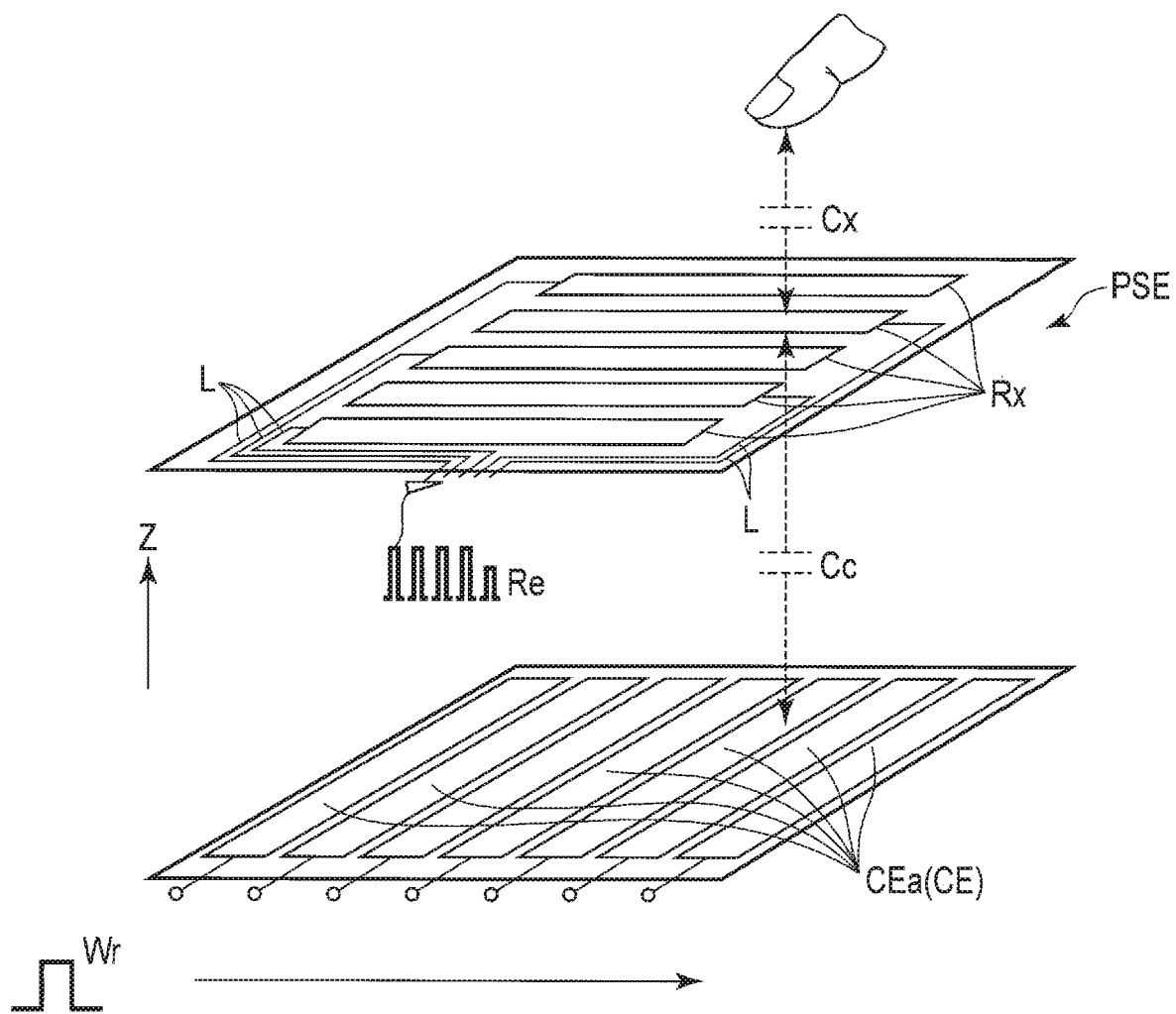
FIG. 21 is an illustration for explanation of a principle of an example of a position detecting method.

As shown in FIG. 21, the position detection sensor PSE comprises position detection electrodes Rx and the common electrode CE. The common electrode CE includes divisional electrodes CEa. The position detection electrodes Rx are located in at least the display area DA. The positions where the position detection electrodes Rx are disposed are not particularly limited, but the position detection electrodes Rx can be disposed on the second substrate SUB2 or the cover member CG In this case, gaps can be formed between the position detection electrodes Rx or inside the position detection electrodes Rx by forming the position detection electrodes Rx with fine-wires or forming the position detection electrodes Rx in a mesh. The detected object and the pixel electrode can be coupled by electrostatic capacitance through the gaps. A capacitance Cc exists between the divisional electrode CEa and the position detection electrode Rx. In other words, the position detection electrodes Rx are subjected to electrostatic capacitive coupling with the divisional electrodes CEa (common electrode CE). A pulse-like first signal (sensor drive signal) Wr is supplied to each of the divisional electrodes CEa, sequentially, in a predetermined cycle. In this example, the user's finger is assumed to be close to a position where a specific detection electrode Rx and a specific divisional electrode CEa intersect. The capacitance Cx is generated by the user's finger close to the position detection electrode Rx. When the pulse-like first signal Wr is supplied to the divisional electrodes CEa, a pulse-like second signal (sensor output value) Re at a level lower than the pulse obtained from the other position detection electrodes can be obtained from a specific position detection electrode Rx. The second signal Re can be obtained via a lead wiring. In other words, when the input position information which is the position information of the user's finger in the display area DA is detected, the driving IC IC1 (common electrode drive circuit) supplies the first signal Wr to the common electrode CE (divisional electrodes CEa) to allow the sensor signal to be generated between the common electrode CE and the position detection electrode Rx. The driving IC IC2 is connected to the position detection electrode Rx to read the second signal Re indicating variation of the sensor signal (for example, the electrostatic capacitance generated at the position detection electrode Rx).

The driving IC IC2 or the control module CM can detect two-dimensional position information of the finger in the X-Y plane of the position detection sensor PSE, based on the timing of supplying the first signal Wr to the divisional electrodes CEa and on the second signal Re from each of the position detection electrodes Rx. In addition, the capacitance Cx obtained when the finger is close to the position detection electrode Rx is different from that obtained when the finger is remote from the position detection electrode Rx. For this reason, the level of the second signal Re obtained when the finger is close to the position detection electrode Rx is different from that obtained when the finger is remote from the position detection electrode Rx. The driving IC IC2 or the control module CM therefore can also detect proximity of the finger to the position detection sensor PSE (i.e., a distance in a third direction Z orthogonal to the first direction X and the second direction Y), based on the level of the second signal Re.

Thus, when the second detection unit DU2 drives the position detection sensor PSE and detects the position information of the finger, in the position detection driving for detecting the position information of the finger. Furthermore, the pixel electrodes are changed to the electrically floating state, in the position detection driving.

Next, the first detection unit DU1 sets the pixel electrodes of the area where the finger is located to be a target of sensing, based on the position information, in the sensing driving for detecting the fingerprint of the finger. The first detection unit DU1 writes the write signal Vw to each of the pixel electrodes via the multiplexer MU, the corresponding signal line S and the corresponding pixel switch, and reads the read signal Vr indicating the variation of the write signal from each of the pixel electrodes. The first detection unit DU1 supplies the potential adjustment signal Va which is synchronized with the write signal Vr and equivalent in phase and amplitude to the write signal Vr, to the common electrode CE.

According to the sensor-equipped liquid crystal display device DSP and the method of driving the sensor-equipped liquid crystal display device DSP, of the sixth embodiment, the liquid crystal display device DSP comprises a scanning line, a signal line S, a pixel switch, a common electrode CE, a pixel electrode, a scanning line drive circuit, and a multiplexer MU, similarly to the sensor SE of the above-described embodiments. For this reason, the same advantages as those of the first embodiment can also be obtained in the sixth embodiment.

The liquid crystal display device DSP further comprises the position detection sensor PSE and the second detection unit DU2. Since the fine sensing does not need to be performed with the pixel fineness in the entire display area DA, the time period required for the sensing can be reduced.

In the present embodiment, too, the detection electrodes DE can be bundled or displaced and can detect the fingerprint. Furthermore, in the present embodiment, the detection electrodes DE may be bundled or displaced and may detect the finger position information. In this case, addition of the position detection electrodes Rx, the second detection unit DU2 and the like to the liquid crystal display device DSP can be omitted.

Thus, the liquid crystal display device DSP equipped with the sensor having excellent detection accuracy, and a method of driving the sensor-equipped liquid crystal display device DSP can be obtained.

Seventh Embodiment

Next, a liquid crystal display device DSP of a seventh embodiment will be described. In the present embodiment, the liquid crystal display device is a sensor-equipped liquid crystal display device.

Figure 22:
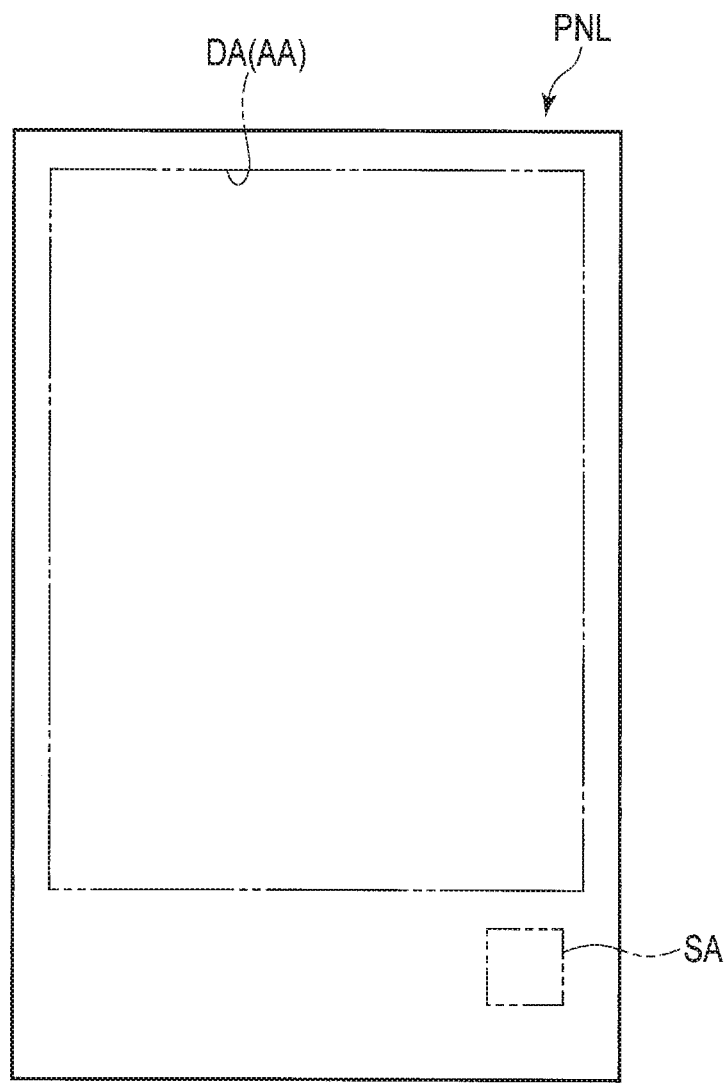
FIG. 22 is a plan view showing a configuration of a liquid crystal display panel in a liquid crystal display device of a seventh embodiment.

As shown in FIG. 22, a sensing area SA is located outside a display area DA, unlike the fifth embodiment (FIG. 18). The display driving in the display area DA and the sensing driving in the sensing area SA can be performed independently of each other. In addition, degradation in display quality in the display area DA can be suppressed as compared with a case of setting the sensing area SA to be in a part of the display area DA.

A first substrate SUB1 can be formed in the same manufacturing process as the display area DA and the sensing area SA. With reference to FIG. 4 and FIG. 19, for example, the pixel electrodes PE in the display area DA and the detection electrodes DE in the sensing area SA can be disposed in the same layer. The pixel electrodes PE and the detection electrode DE are disposed on the fourth insulating film 14.

In the seventh embodiment, too, sensing can be performed by changing the operation to either of the first mode (self-capacitive sensing mode) and the second mode (mutual-capacitive sensing mode).

Thus, the liquid crystal display device DSP equipped with the sensor having excellent detection accuracy, and a method of driving the sensor-equipped liquid crystal display device DSP can also be obtained by the seventh embodiment.

Eight Embodiment

Next, a liquid crystal display device DSP of an eighth embodiment will be described. In the present embodiment, the liquid crystal display device is a sensor-equipped liquid crystal display device.

As shown in FIG. 23, pixels PX are arrayed in a matrix in the display area DA. The pixels PX are surrounded by scanning lines G connected to a scanning line drive circuit GD and signal lines S connected to a multiplexer MU.

A sensing area SA is set in a part of the display area DA. An interior of the sensing area SA is configured similarly to the interior of the active area AA shown in FIG. 1. For this reason, the pixel electrodes PE and the detection electrodes DE can be disposed in the same layer in the present embodiment, too.

Thus, the liquid crystal display device DSP equipped with the sensor having excellent detection accuracy, and a method of driving the sensor-equipped liquid crystal display device DSP can also be obtained by the eighth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. It is possible to combine two or more embodiments if needed.

For example, the multiplexer MU may be configured as shown in FIG. 24. The multiplexer MU of the modified example shown in FIG. 24 is different from the multiplexer MU shown in FIG. 5 with respect to features that each of control switches CSW is composed of an N-channel thin-film transistor and that the multiplexer MU are formed without a connection line W2. Each of the control switches CSW is changed to either of a state of making electrically connection between the connection line W1 and signal lines S and a state of changing the signal lines S to be in an electrically floating state.

The driving IC IC1 and the driving IC IC2 may be formed integrally. In other words, the driving IC IC1 and the driving IC IC2 may be integrated on a single driving IC.

A controller of the circuits, the driving IC, the control module and the like is not limited to the control line drive circuit CD (scanning line drive circuit), the multiplexer MU, the control module CM or the driving ICs IC1 and IC2, but can be variously modified, and may be a controller capable of electrically controlling the first substrate SUB1 (liquid crystal display panel PNL) and the position detection electrodes Rx (position detection sensor PSE).

In the above-described embodiments, the liquid crystal display device is disclosed as an example of the display device. However, the above-described embodiments are applicable to all types of flat-panel display devices such as organic electroluminescent display devices, other self-luminous display devices, and electronic paper-type display devices including electrophoresis elements. It is needless to say that the above-described embodiments can be applied to middle or small display devices and large display devices without particular limitation.

What is claimed is:

1. A sensor comprising:
   a first control line;
   a first signal line;
   a first auxiliary line;
   a first detection electrode;
   a first detection switch connected to the first detection electrode, the first control line and the first signal line;
   a second detection switch connected to the first detection electrode, the first control line and the first auxiliary line;
   a first circuit connected to the first control line, and supplying a drive signal to the first control line to change a state of the first detection switch and the second detection switch to either of a first connection state and a second connection state; and
   a second circuit connected to the first signal line and the first auxiliary line,
   wherein
   the first detection electrode is electrically connected to the first signal line and electrically disconnected from the first auxiliary line in the first connection state, and
   the first detection electrode is electrically connected to the first auxiliary line and electrically disconnected from the first signal line in the second connection state.

2. The sensor of claim 1, wherein
   the second circuit writes a write signal to the first detection electrode via the first signal line and the first detection switch, reads a read signal indicating variation of the write signal from the first detection electrode, and supplies a potential adjustment signal to the first auxiliary line, in the first connection state, and
   the potential adjustment signal is synchronized with the write signal and is equivalent in phase and amplitude to the write signal, in sensing drive of performing sensing.

3. The sensor of claim 2, further comprising:
a first detection unit supplying a power source voltage to the first circuit; and
a superposition signal superposed on each of the drive signal and the power source voltage in the sensing drive,
wherein
the superposition signal is synchronized with the write signal and is equivalent in phase and amplitude to the write signal.

4. The sensor of claim 2, further comprising:
a first detection unit supplying a control signal to the second circuit; and
a superposition signal superposed on the control signal in the sensing drive,
wherein
the superposition signal is synchronized with the write signal and is equivalent in phase and amplitude to the write signal.

5. The sensor of claim 2, further comprising:
a shielding electrode located to overlap the first signal line, and connected to the first auxiliary line,
wherein
the first auxiliary line is electrically connected to the second circuit, and
the second circuit further supplies the potential adjustment signal to the shielding electrode via the first auxiliary line.

6. The sensor of claim 2, further comprising:
a second signal line connected to the second circuit;
a second detection electrode;
a third detection switch connected to the second detection electrode, the first control line and the second signal line; and
a fourth detection switch connected to the second detection electrode, the first control line and the first auxiliary line,
wherein
the second circuit includes a first control switch for changing either of a first change state of supplying the write signal to the first signal line and a second change state of supplying the potential adjustment signal to the first signal line, and a second control switch for changing either of a first change state of supplying the write signal to the second signal line and a second change state of supplying the potential adjustment signal to the second signal line, and
the second circuit, in a sensing period of the sensing drive:
changes the first control switch to the first change state and the second control switch to the first change state, changes the first detection switch and the second detection switch to the first connection state by the drive signal, and changes the third detection switch and the fourth detection switch to the first connection state by the drive signal;
writes the write signal to the first detection electrode and reads the read signal indicating variation of the write signal from the first detection electrode, via the first control switch, the first signal line and the first detection switch; and
writes the write signal to the second detection electrode and reads the read signal indicating variation of the write signal from the second detection electrode, via the second control switch, the second signal line and the third detection switch.

7. The sensor of claim 2, further comprising:
a second control line connected to the first circuit;
a third detection electrode;
a fifth detection switch connected to the third detection electrode, the second control line and the first signal line; and
a sixth detection switch connected to the third detection electrode, the second control line and the first auxiliary line,
wherein
the first auxiliary line is electrically connected to the second circuit,
the first circuit supplies the drive signal to the second control line,
the first detection switch and the second detection switch electrically connect the first signal line and the first detection electrode to each other in the first connection state, and electrically connect the first auxiliary line and the first detection electrode to each other in the second connection state,
the fifth detection switch and the sixth detection switch are changed to either of a first connection state of electrically connecting the first signal line and the third detection electrode to each other and a second connection state of electrically connecting the first auxiliary line and the third detection electrode to each other, by the drive signal, and
the second circuit, in a sensing period of the sensing drive:
changes the state of the first detection switch and the second detection switch to the first connection state and a state of the fifth detection switch and the sixth detection switch to the second connection state by the drive signal;
writes the write signal to the first detection electrode and reads the read signal indicating variation of the write signal from the first detection electrode, via the first signal line and the first detection switch; and
supplies the potential adjustment signal to the third detection electrode via the first auxiliary line and the sixth detection switch.

8. A sensor-equipped display device comprising a display panel,
the display panel comprising:
a first control line;
signal lines including a first signal line;
auxiliary lines;
a first detection electrode;
a first detection switch connected to the first detection electrode, the first control line and the signal line,
a second detection switch connected to the first detection electrode, the first control line and the corresponding auxiliary line;
a first circuit disposed outside a display area, connected to the first control line, supplying a drive signal to the first control line, and changing a state of the first detection switch and the second detection switch to either of a first connection state and a second connection state; and
a second circuit disposed outside the display area, and connected to the signal lines and the auxiliary lines,
wherein
the first detection electrode is electrically connected to the first signal line and electrically disconnected from the corresponding auxiliary line in the first connection state, and
the first detection electrode is electrically connected to the corresponding auxiliary line and electrically disconnected from the first signal line in the second connection state.

9. The sensor-equipped display device of claim 8, further comprising:
a pixel electrode and a common electrode opposed to the pixel electrode to generate an electric field therebetween in a display period,
wherein
the first detection electrode is arranged in the same layer as the pixel electrode.

10. The sensor-equipped display device of claim 8, wherein
in a sensing period, the second circuit:
writes a write signal to the first detection electrode via the first signal line and the first detection switch, and reads a read signal indicating variation of the write signal from the detection electrode; and
supplies a potential adjustment signal which is synchronized with the write signal and is equivalent in phase and amplitude to the write signal.

11. The sensor-equipped display device of claim 8, further comprising:
a pixel electrode and a common electrode opposed to the pixel electrode to generate an electric field therebetween in a display period;
a first detection unit connected to the display panel to control the drive of the first circuit and the second circuit;
a position detection sensor located in the display area of the display panel; and
a second detection unit connected to the position detection sensor,
wherein
in a detection period, in position detection drive of detecting position information of a detected object, the second detection unit drives the position detection sensor to detect the position information of the detected object, and
in the detection period, in sensing drive of detecting an uneven pattern of the detected object, the first detection unit sets a first detection electrode in an area where the detected object is located as a target of sensing, based on the position information, writes a write signal to the first detection electrode of the target of sensing via the second circuit, the first signal line and the first detection switch, reads a read signal indicating variation of the write signal from the first detection electrode, and supplies a potential adjustment signal which is synchronized with the write signal and equivalent in phase and amplitude to the write signal to the common electrode.

12. The sensor-equipped display device of claim 9, wherein
the first detection electrode is located above the common electrode, and
the pixel electrodes and the detection electrode are disposed in a same layer.

* * * * *